(12) United States Patent
Won et al.

(10) Patent No.: US 11,876,052 B2
(45) Date of Patent: Jan. 16, 2024

(54) SEMICONDUCTOR DIE BONDING STRUCTURE

(71) Applicant: SK hynix Inc., Icheon-si (KR)

(72) Inventors: Na Bin Won, Icheon-si (KR); Jong Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 66 days.

(21) Appl. No.: 17/324,973

(22) Filed: May 19, 2021

(65) Prior Publication Data

US 2022/0216155 A1 Jul. 7, 2022

(30) Foreign Application Priority Data

Jan. 6, 2021 (KR) .................. 10-2021-0001299

(51) Int. Cl.
*H01L 23/04* (2006.01)
*H01L 23/538* (2006.01)
*H01L 25/065* (2023.01)

(52) U.S. Cl.
CPC ...... *H01L 23/5384* (2013.01); *H01L 23/5386* (2013.01); *H01L 25/0657* (2013.01)

(58) Field of Classification Search
CPC ............ H01L 23/5384; H01L 23/5386; H01L 25/0657
See application file for complete search history.

(56) References Cited

U.S. PATENT DOCUMENTS 9,443,802 B2    9/2016  Kagawa et al.
2021/0366855 A1* 11/2021 Okina .................. H01L 23/5226

FOREIGN PATENT DOCUMENTS

| KR | 100505394 B1 | 10/2005 |
| KR | 1020130062033 A | 6/2013 |
| KR | 101870155 B1 | 6/2018 |
| KR | 1020200036692 A | 4/2020 |

* cited by examiner

*Primary Examiner* — Trang Q Tran
(74) *Attorney, Agent, or Firm* — William Park & Associates Ltd.

(57) ABSTRACT

A semiconductor die bonding structure includes a lower die including a lower top bonding dielectric layer and a lower connection structure and an upper die stacked over the lower die and including an upper bottom bonding dielectric layer and an upper connection structure. The lower top bonding dielectric layer and the upper bottom bonding dielectric layer are connected. The lower connection structure and the upper connection structure are connected.

18 Claims, 24 Drawing Sheets

SEMICONDUCTOR DIE BONDING STRUCTURE

CROSS-REFERENCE TO RELATED APPLICATIONS

This application claims priority under 35 U.S.C. § 119(a) to Korean Patent Application No. 10-2021-0001299 filed on Jan. 6, 2021, which is incorporated herein by reference in its entirety.

BACKGROUND

1. Technical Field

Exemplary embodiments of the disclosure relate to a semiconductor die bonding structure and a semiconductor die stack, and more particularly, to a semiconductor die bonding structure and a semiconductor die stack including a pad structure having an increased area.

2. Related Art

Semiconductor die bonding structures and semiconductor die stack structures in which a plurality of semiconductor dies are bonded and stacked for broadband and high capacity in various electronic products have been proposed.

SUMMARY

In accordance with an embodiment of the disclosure, a semiconductor die bonding structure may include a lower die including a lower top bonding dielectric layer and lower connection structures and an upper die stacked over the lower die and including an upper bottom bonding dielectric layer and upper connection structures. The lower top bonding dielectric layer and the upper bottom bonding dielectric layer may be directly bonded to each other. The lower connection structures and the upper connection structures may be directly bonded to each other. The lower connection structures may include lower top bonding pad structures having a first width in a first horizontal direction and a second width in a second horizontal direction. The upper connection structures may include upper bottom bonding pad structures having a third width in the first horizontal direction and a fourth width in the second horizontal direction. The first horizontal direction and the second horizontal direction may be substantially perpendicular to each other. The second width may be greater than the first width. The second width may be greater than the fourth width.

In accordance with another embodiment of the disclosure, a semiconductor die bonding structure may include a lower die including a lower top bonding dielectric layer and lower connection structures and an upper die stacked over the lower die and including an upper bottom bonding dielectric layer and upper connection structures. Each of the lower connection structures may include a lower through-via structure including a lower through-via plug, a lower through-via barrier layer surrounding a side surface of the lower through-via plug, and a lower through-via liner layer surrounding a side surface of the lower through-via barrier layer; and a lower top bonding pad structure including a lower top bonding pad base, a lower top bonding pad barrier layer over the lower top bonding pad base, and a lower top bonding pad body over the lower top bonding pad barrier layer, and the lower top bonding dielectric layer and the upper bottom bonding dielectric layer are directly bonded to each other, and each of the lower top bonding pad structures and each of the upper connection structures are bonded to each other, and an upper surface of each of the lower connection structures has a first width in a first horizontal direction and a second width in a second horizontal direction, and a lower surface of each of the upper connection structures has a third width in the first horizontal direction and a fourth width in the second horizontal direction. The first horizontal direction and the second horizontal direction may be substantially perpendicular to each other. The second width may be at least twice as large as the first width and the fourth width.

In accordance with yet another embodiment of the disclosure, a semiconductor die bonding structure may include a lower die and an upper die stacked over the lower die. The lower die may include a lower substrate, a lower inter-layer dielectric layer over an active surface of the lower substrate, a lower wiring dielectric layer over the lower inter-layer dielectric layer, a lower top bonding dielectric layer over the lower wiring dielectric layer, lower through-via structures vertically penetrating the lower substrate and the lower inter-layer dielectric layer, and lower top bonding pad structures over the lower through-via structures. The upper die may include an upper substrate, an upper passivation layer over a non-active surface of the upper substrate, an upper bottom bonding dielectric layer over a lower surface of the upper passivation layer, and upper through-via structures vertically penetrating the upper substrate, the upper passivation layer, and the upper bottom bonding dielectric layer. The lower top bonding dielectric layer and the upper bottom bonding dielectric layer may be directly bonded to each other. Each of the lower top bonding pad structures and each of the upper through-via structures may be directly bonded to each other. Each of the lower top bonding pad structures may have a first width in a first horizontal direction and a second width in a second horizontal direction. Each of the upper through-via structures may have a third width in the first horizontal direction and a fourth width in the second horizontal direction. The first horizontal direction and the second horizontal direction may be substantially perpendicular to each other. The second width may be greater than the first width and the fourth width.

In accordance with still another embodiment of the disclosure, a semiconductor die bonding structure may include a lower die including a lower top bonding dielectric layer and lower connection structures, and an upper die stacked over the lower die and including an upper bottom bonding dielectric layer and upper connection structures. The lower top bonding dielectric layer and the upper bottom bonding dielectric layer may be directly bonded to each other. Each of the lower connection structures and each of the upper connection structures may be vertically aligned to be directly bonded. The lower connection structures and the upper connection structures may be arranged side by side in a first horizontal direction. An upper surface of each of the lower connection structures may have a first width in the first horizontal direction and a second width in a second horizontal direction. A lower surface of each of the upper connection structures may have a third width in the first horizontal direction and a fourth width in the second horizontal direction. The first horizontal direction and the second horizontal direction may be substantially perpendicular to each other. The second width may be greater than the first width. The second width may be greater than the fourth width.

In accordance with an embodiment of the disclosure, a semiconductor die bonding structure may include a lower die including a lower top bonding dielectric layer and a lower connection structure; and an upper die stacked over the lower die and including an upper bottom bonding dielectric layer and an upper connection structure. The lower top bonding dielectric layer and the upper bottom bonding dielectric layer may be directly bonded to each other. The lower connection structure and the upper connection structure may be directly bonded to each other. The lower connection structure may include a lower top bonding pad structure having a first width in a first horizontal direction and a second width in a second horizontal direction. The first horizontal direction and the second horizontal direction may be substantially perpendicular to each other.

In accordance with an embodiment of the disclosure, a semiconductor die bonding structure may include a lower die including a lower top bonding dielectric layer and a lower connection structure; and an upper die stacked over the lower die and including an upper bottom bonding dielectric layer and an upper connection structure. The lower top bonding dielectric layer and the upper bottom bonding dielectric layer may be directly bonded to each other. The lower connection structure and the upper connection structure may be directly bonded to each other. The upper connection structure may include an upper bottom bonding pad structure having a fifth width in the first horizontal direction and a sixth width in the second horizontal direction. The first horizontal direction and the second horizontal direction may be substantially perpendicular to each other.

BRIEF DESCRIPTION OF THE DRAWINGS

FIG. 9B is a perspective view illustrating lower top bonding pad bodies and upper bottom bonding pad barrier layers.

DETAILED DESCRIPTION

Figure 1A:
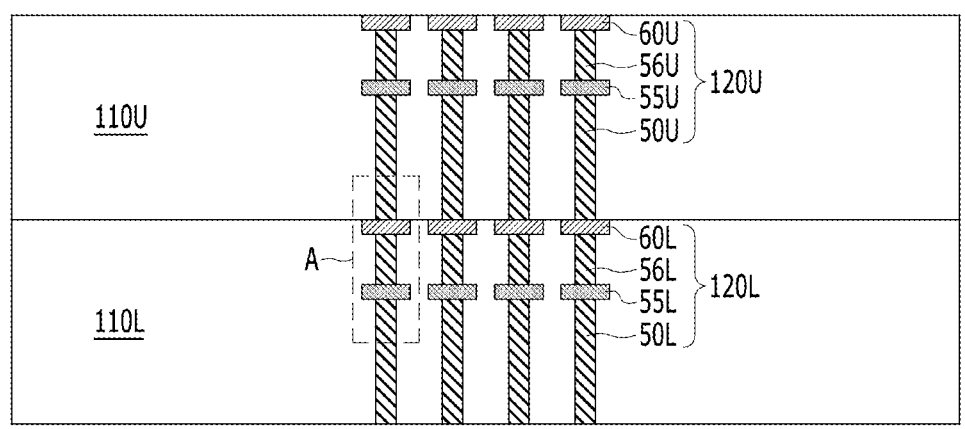
FIGS. 1A and 1B are side cross-sectional views schematically illustrating semiconductor die bonding structures in accordance with embodiments of the disclosure.

Examples of embodiments of the disclosure will be described below in more detail with reference to the accompanying drawings. The disclosure may, however, be embodied in different forms and should not be construed as limited to the embodiments set forth herein. Throughout the disclosure, like reference numerals refer to like parts throughout the various figures and embodiments of the disclosure.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the disclosure will be described in detail with reference to the attached drawings.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the disclosure may be directed to providing a semiconductor die bonding structure and a semiconductor die stack having a hybrid bonding structure with an enhanced bonding force.

Figure 1B:
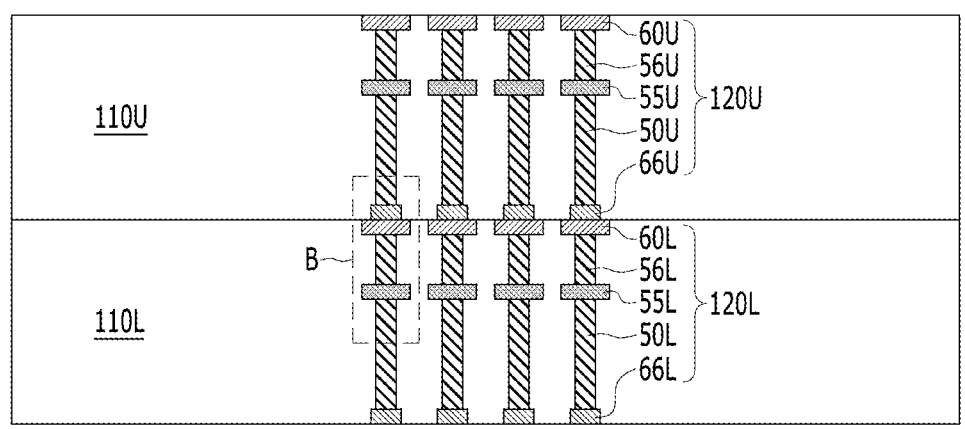

FIGS. 1A and 1B are side cross-sectional views schematically illustrating semiconductor die bonding structures in accordance with embodiments of the disclosure. Referring to FIG. 1A, a semiconductor die bonding structure 100A in accordance with the embodiment of the present disclosure may include a lower die 110L and an upper die 110U that are bonded by a hybrid bonding method. The lower die 110L may include a lower connection structure 120L, and the upper die 110U may include an upper connection structure 120U. The lower connection structure 120L and the upper connection structure 120U may include a conductor. The lower connection structure 120L and the upper connection structure 120U may be bonded to be electrically connected. The lower connection structure 120L may include a lower through-via structure 50L and a lower top bonding pad structure 60L, and the upper connection structure 120U may include an upper through-via structure 50U and an upper top bonding pad structure 60U. The lower connection structure 120L may further include a lower via pad 55L and a lower wiring via 56L, and the upper connection structure 120U may further include an upper via pad 55U and an upper wiring via 56U. According to an embodiment of the disclosure, the upper connection structure 120U might not include the upper top bonding pad structure 60U.

The lower die 110L may include one among a base die, a logic device, a memory device, and other semiconductor devices. The base die may include an internal logic circuit, a test circuit, and bumps (not shown) on a lower surface. According to an embodiment of the disclosure, the lower die 110L may include an interposer or a package substrate. The logic device may include a chipset circuit, a control circuit, or a signal processor. The memory device may include a volatile or nonvolatile semiconductor memory such as DRAM, SRAM, ReRAM, PcRAM, MRAM, NOR Flash, or NAND Flash. The upper die 110U may include one among a logic device, a memory device, and other semiconductor devices.

The lower connection structure 120L may vertically penetrate the lower die 110L, and the upper connection structure 120U may vertically penetrate the upper die 110U. The lower through-via structure 50L and the upper through-via structure 50U may be electrically connected through the lower top bonding pad structure 60L. The lower via pad 55L and the lower wiring via 56L may be disposed between the lower through-via structure 50L and the lower top bonding pad structure 60L so that the lower through-via structure 50L and the lower top bonding pad structure 60L may be electrically connected. The upper via pad 55U and the upper wiring via 56U may be disposed between the upper through-via structure 50U and the upper bottom bonding pad structure 66U to electrically connect the upper through-via structure 50U and the upper bottom bonding pad structure 66U. The upper surface of the lower top bonding pad structure 60L may be coplanar with the upper surface of the lower die 110L. The upper surface of the upper top bonding pad structure 60U may be coplanar with the upper surface of the upper die 110U. According to an embodiment of the disclosure, the upper top bonding structure 60U may be omitted. The lower top bonding pad structure 60L and the upper through-via structure 50U may directly contact each other to be bonded. An additional die may be further disposed below the lower die 110L, and an additional die may be further disposed over the upper die 110U.

Referring to FIG. 1B, a semiconductor die bonding structure 100B in accordance with an embodiment of the present disclosure may include a lower die 110L and an upper die 110U. The lower die 110L may include a lower connection structure 120L, and the upper die 110U may include an upper connection structure 120U. The lower connection structure 120L may include a lower through-via structure 50L, a lower top bonding pad structure 60L, and a lower bottom bonding pad structure 66L. The upper connection structure 120U may include an upper through-via structure 50U, an upper top bonding pad structure 60U, and an upper bottom bonding pad structure 66U. The lower bottom bonding pad structure 66L may be disposed in the lower portion of the lower through-via structure 50L. The lower surface of the lower bottom bonding pad structure 66L may be coplanar with the lower surface of the lower die 110L. The upper bottom bonding pad structure 66U may be disposed in the lower portion of the upper through-via structure 50U. The lower surface of the upper bottom bonding pad structure 66U may be coplanar with the lower surface of the upper die 110U. The lower top bonding pad structure 60L and the upper bottom bonding pad structure 66U may directly contact each other to be bonded. According to an embodiment of the disclosure, the lower bottom bonding pad structure 66L may be omitted.

Figure 2A:
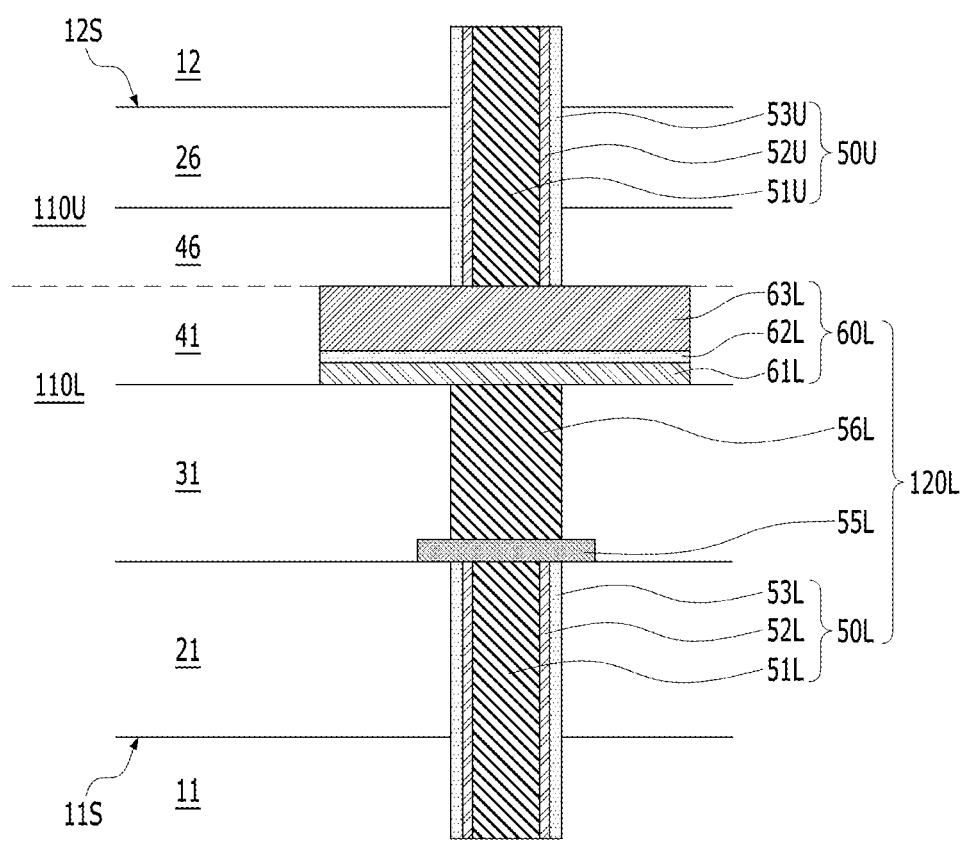
FIG. 2A is an enlarged view of an area A shown in FIG. 1A.

FIG. 2A is an enlarged view of an area A shown in FIG. 1A. Referring to FIG. 2A, a semiconductor die bonding structure 100A according to the embodiment of the present disclosure may include the lower die 110L and the upper die 110U that are bonded by a hybrid bonding method.

The lower die 110L may include a lower substrate 11, a lower inter-layer dielectric layer 21, a lower wiring dielectric layer 31, a lower top bonding dielectric layer 41, and a lower connection structure 120L. The lower connection structure 120L may include a lower through-via structure 50L, a lower via pad 55L, a lower wiring via 56L, and a lower top bonding pad structure 60L.

The lower substrate 11 may include one among a silicon (Si) layer, a compound semiconductor layer, an epitaxially grown semiconductor layer, and other diverse semiconductor layers.

The lower inter-layer dielectric layer 21 may be formed over the active surface 11S of the lower substrate 11. A transistor may be formed over the active surface 11S of the lower substrate 11. The lower wiring dielectric layer 31 may be formed over the lower inter-layer dielectric layer 21. The lower inter-layer dielectric layer 21 and the lower wiring dielectric layer 31 may include one or more among silicon oxide ($SiO_2$), silicon nitride (SiN), and other inorganic dielectric materials.

The lower top bonding dielectric layer 41 may include silicon oxide ($SiO_2$). According to an embodiment of the disclosure, the lower top bonding dielectric layer 41 may include one or more selected among silicon nitride (SiN), silicon oxynitride (SiON), and silicon carbonitride (SiCN). The lower top bonding dielectric layer 41 may surround the side surfaces of the lower top bonding pad structure 60L.

The lower through-via structure 50L may vertically penetrate the lower substrate 11 and the lower inter-layer dielectric layer 21. The lower through-via structure 50L may include a lower through-via plug 51L, a lower through-via barrier layer 52L, and a lower through-via liner layer 53L. The lower through-via plug 51L may include a pillar-shaped conductor. According to an embodiment of the disclosure, the lower through-via plug 51L may include a metal, such as copper (Cu), tungsten (W), or aluminum (Al). The lower through-via barrier layer 52L may have a cylindrical shape surrounding a side surface of the lower through-via plug 51L. The lower through-via barrier layer 52L may include a barrier metal layer. For example, it may include a metal compound, such as titanium nitride (TiN) or tantalum nitride (TaN). The lower through-via barrier layer 52L may have a double-layer structure including an inner titanium nitride (TiN) layer and an outer tantalum nitride (TaN) layer. According to an embodiment of the disclosure, the lower through-via barrier layer 52L may have a double-layer structure including an inner tantalum nitride (TaN) layer and an outer titanium nitride (TiN) layer. According to an embodiment of the disclosure, the lower through-via barrier layer 52L may have a single-layer structure including either titanium nitride (TiN) or tantalum nitride (TaN). The lower through-via liner layer 53L may have a cylindrical shape surrounding a side surface of the lower through-via barrier layer 52L. The lower through-via liner layer 53L may include a dielectric material for electrically insulating the lower through-via plug 51L and the lower through-via barrier layer 52L from the lower substrate 11. For example, the lower through-via liner layer 53L may include one selected among dielectric materials, such as silicon oxide (SiO$_2$), silicon nitride (SiN), silicon oxynitride (SiON), and silicon carbonitride (SiCN).

The lower via pad 55L may be formed between the lower inter-layer dielectric layer 21 and the lower wiring dielectric layer 31, and between the lower through-via structure 55L and the lower wiring via 56L. The lower via pad 55L may contact the upper end of the lower through-via structure 50L. For example, the lower via pad 55L may directly contact the upper end of the lower through-via plug 51L of the lower through-via structure 50L, the upper end of the lower through-via barrier layer 52L, and the upper end of the lower through-via liner layer 53L. The lower via pad 55L may include a metallic material such as tungsten (W), aluminum (Al), copper (Cu), or titanium nitride (TiN).

The lower wiring via 56L may vertically penetrate the lower wiring dielectric layer 31 and may be formed between the lower via pad 55L and the lower through-via structure 50L. The lower wiring via 56L may contact the upper surface of the lower via pad 55L and the lower surface of the lower through-via structure 50L. In other words, the lower wiring via 56L may electrically connect the lower via pad 55L and the lower through-via structure 50L to each other. The lower wiring via 56L may include a metallic material such as tungsten (W), aluminum (Al), copper (Cu), or titanium nitride (TiN).

The lower top bonding pad structure 60L may be disposed over the lower wiring dielectric layer 31. The lower top bonding pad structure 60L may include a lower top bonding pad base 61L, a lower top bonding pad barrier layer 62L over the lower top bonding pad base 61L, and a lower top bonding pad body 63L over the lower top bonding pad barrier layer 62L. The lower top bonding pad base 61L may include a metal such as aluminum (Al). The lower top bonding pad barrier layer 62L may include a barrier metal, such as titanium nitride (TiN) or tantalum nitride (TaN). According to an embodiment of the disclosure, the lower top bonding pad barrier layer 62L may include a barrier metal layer and a seed layer in the upper portion. The seed layer may include a seed metal for a plating process, such as copper (Cu) or nickel (Ni). The lower top bonding pad body 63L may include one or more selected among copper (Cu) and other metals.

The upper die 110U may include an upper substrate 12, an upper passivation layer 26, an upper bottom bonding dielectric layer 46, and an upper connection structure (120U in FIG. 1A). The upper connection structure 120U may include an upper through-via structure 50U.

The upper substrate 12 may include one among a silicon (Si) layer, a compound semiconductor layer, an epitaxially grown semiconductor layer, and other diverse semiconductor layers.

The upper passivation layer 26 may be formed over the lower surface of the upper substrate 12, that is, over the non-active surface 12S. The non-active surface 12S may be a surface on which a transistor is not formed and may be a surface opposite to the active surface. The upper passivation layer 26 may include at least one or more among silicon nitride (SiN) and silicon oxide (SiO$_2$).

The upper bottom bonding dielectric layer 46 may include silicon oxide (SiO$_2$). According to an embodiment of the disclosure, the upper bottom bonding dielectric layer 46 may include at least one selected among silicon nitride (SiN), silicon oxynitride (SiON), and silicon carbonitride (SiCN). The upper bottom bonding dielectric layer 46 and the lower top bonding dielectric layer 41 may include the same material. The upper bottom bonding dielectric layer 46 may surround a side surface of the upper through-via structure 50U.

The upper through-via structure 50U may vertically penetrate the upper substrate 12 and the upper passivation layer 26. The upper through-via structure 50U may include an upper through-via plug 51U, an upper through-via barrier layer 52U, and an upper through-via liner layer 53U. The upper through-via plug 51U may include a pillar-shaped conductor. According to an embodiment of the disclosure, the upper through-via plug 51U may include the same material as the lower through-via plug 51L. The upper through-via barrier layer 52U may have a cylindrical shape surrounding a side surface of the upper through-via plug 51U. The upper through-via barrier layer 52U may include the same material as the lower through-via barrier layer 52L. The upper through-via liner layer 53U may have a cylindrical shape surrounding a side surface of the upper through-via barrier layer 52U. The upper through-via liner layer 53U may include a dielectric material for electrically insulating the upper through-via plug 51U and the upper through-via barrier layer 52U from the upper substrate 12. The upper through-via liner layer 53U may include the same material as the lower through-via liner layer 53L.

The lower top bonding pad body 63L of the lower top bonding pad structure 60L may directly contact the lower end of the upper through-via structure 50U. For example, the lower top bonding pad body 63L and the upper through-via plug 51U may be directly bonded to each other to be electrically connected. The upper bottom bonding dielectric layer 46 and the lower top bonding dielectric layer 41 may directly contact each other to be bonded. An interface between the upper through-via structure 50U and the lower top bonding pad structure 60L and an interface between the upper bottom bonding dielectric layer 46 and the lower top bonding dielectric layer 41 may be coplanar.

The lower die 110L may further include a lower passivation layer (not shown) which corresponds to the upper passivation layer 26 of the upper die 110U, and a lower bottom bonding dielectric layer (not shown) which corresponds to the upper bottom bonding dielectric layer 46.

The upper die 110U may further include an upper inter-layer dielectric layer (not shown) corresponding to the lower inter-layer dielectric layer 21 of the lower die 110L, an upper wiring dielectric layer (not shown) corresponding to the lower wiring dielectric layer 31, an upper top bonding dielectric layer (not shown) corresponding to the lower top bonding dielectric layer 41, an upper via pad (not shown) corresponding to the lower via pad 55L, an upper wiring via (not shown) corresponding to the lower wiring via 56L, and an upper top bonding pad structure (not shown) corresponding to the lower top bonding pad structure 60L.

Figure 2B:
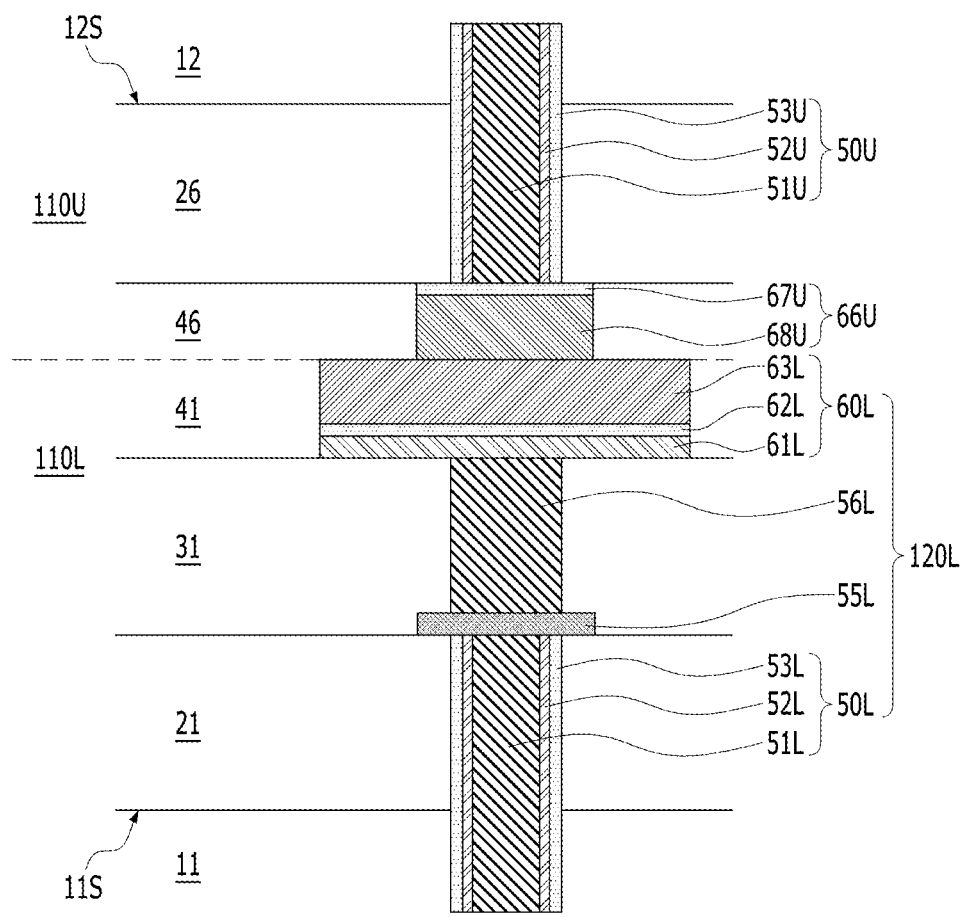
FIG. 2B is an enlarged view of an area B shown in FIG. 1B.

FIG. 2B is an enlarged view of an area B shown in FIG. 1B. Referring to FIG. 2B, a semiconductor bonding die structure 100B in accordance with the embodiment of the present disclosure may include a lower die 110L and an upper die 110U that are bonded by a hybrid bonding method.

The lower die 110L may include a lower substrate 11, a lower inter-layer dielectric layer 21, a lower wiring dielectric layer 31, a lower top bonding dielectric layer 41, and a lower connection structure 120L. The lower connection structure 120L may include a lower through-via structure 50L, a via pad 55L, a wiring via 56L, and a lower top bonding pad structure 60L.

The upper die 110U may include an upper substrate 12, an upper passivation layer 26, an upper bottom bonding dielectric layer 46, and an upper connection structure (120U in FIG. 1B). The upper connection structure 120U may include an upper through-via structure 50U and an upper bottom bonding pad structure 66U. The upper bottom bonding pad structure 66U may include an upper bottom bonding pad barrier layer 67U and an upper bottom bonding pad body 68U. The upper bottom bonding pad barrier layer 67U may be directly formed over the lower surface of the upper through-via structure 50U. In other words, the upper bottom bonding pad barrier layer 67U may contact the lower end of the upper through-via structure 50U. The upper bottom bonding pad body 68U may be formed over the lower surface of the upper bottom bonding pad barrier layer 67U to directly contact and be bond to the lower top bonding pad body 63L of the lower top bonding pad structure 60L. The upper bottom bonding dielectric layer 46 may surround the side surfaces of the upper bottom bonding pad structure 66U. The interface between the upper bottom bonding pad structure 66U and the lower top bonding pad structure 60L and the interface between the upper bottom bonding dielectric layer 46 and the lower top bonding dielectric layer 41 may be coplanar.

Although not specifically illustrated, the lower die 110L may further include a lower bottom bonding pad structure corresponding to the upper bottom bonding pad structure 66U, and the upper die 110U may further include an upper top bonding pad structure corresponding to the lower top bonding pad structure 60L. Also, the lower die 110L may further include a lower passivation layer corresponding to the upper passivation layer 46, and the upper die 110U may further include an upper inter-layer dielectric layer, an upper wiring dielectric layer, and an upper via pad corresponding to the lower inter-layer dielectric layer 21, the lower wiring dielectric layer 31, the lower via pad 55L. Constituent elements that are not described herein will be understood by referring to FIG. 2A. The lower die 110L may further include a lower bottom bonding pad structure (not shown) corresponding to the upper bottom bonding pad structure 66U of the upper die 110U.

Figure 3A:
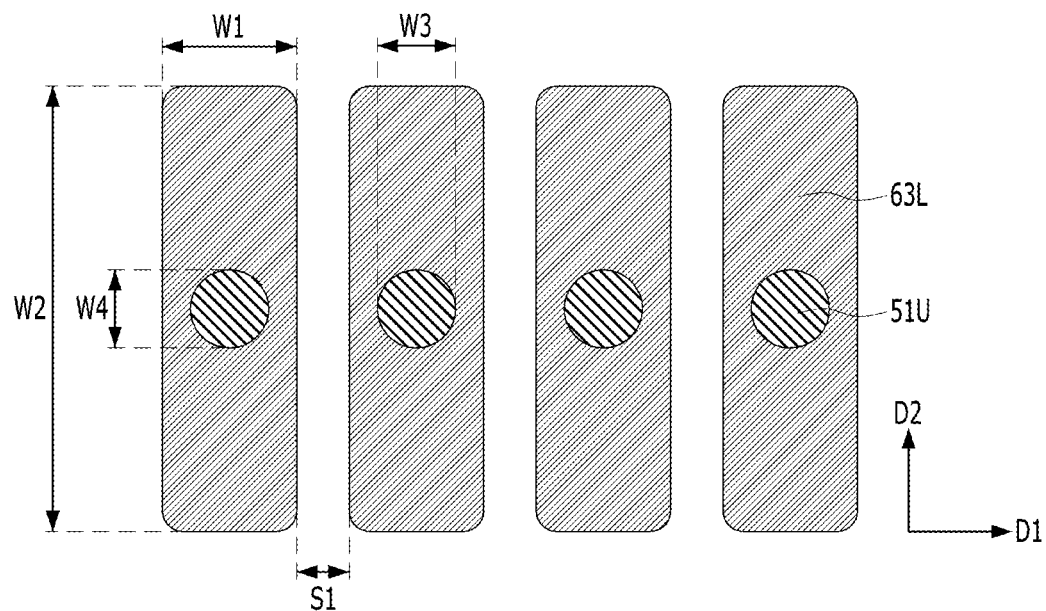
FIG. 3A is a layout illustrating overlapping and alignment of lower top bonding pad bodies of lower top bonding pad structures and upper through-via plugs of upper through-via structures in accordance with an embodiment of the disclosure.
Figure 3B:
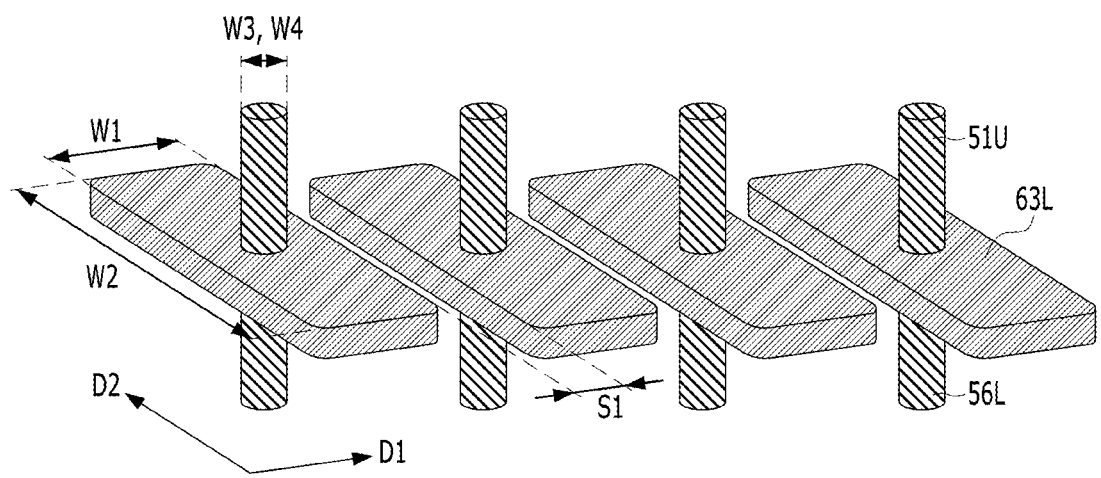
FIG. 3B is a perspective view illustrating a bonding structure of the lower top bonding pad bodies of the lower top bonding pad structures and the upper through-via plugs of the upper through-via structures.

FIG. 3A is a layout illustrating overlapping and alignment of the lower top bonding pad bodies 63L of the lower top bonding pad structures 60L and the upper through-via plugs 51U of the upper through-via structures 50U in accordance with an embodiment of the disclosure, and FIG. 3B is a perspective view illustrating a bonding structure of the lower top bonding pad bodies 63L of the lower top bonding pad structures 60L and the upper through-via plugs 51U of the upper through-via structures 50U.

Referring to FIGS. 3A and 3B, the lower top bonding pad bodies 63L of the lower top bonding pad structures 60L and the upper through-via plugs 51U of the upper through-via structures 50U may be aligned to overlap with each other so that they are bonded to each other.

The upper through-via plugs 51U may be aligned and disposed to overlap with the central regions of the lower top bonding pad bodies 63L, respectively. The lower top bonding pad bodies 63L may be arranged side-by-side in a first horizontal direction D1. The lower top bonding pad bodies 63L may have a rectangular shape elongated in a second horizontal direction D2. According to an embodiment of the disclosure, the corner portions of the lower top bonding pad bodies 63L may be rounded. According to an embodiment of the disclosure, the corner portions of the lower top bonding pad bodies 63L may have a chamfered shape. The upper through-via plugs 51U may also be arranged in parallel in the first horizontal direction D1. The upper through-via plugs 51U may have a circular shape or a square shape. According to an embodiment of the disclosure, the corner portions of the upper through-via plugs 51U may also be rounded or chamfered.

The lower top bonding pad bodies 63L may have a first width W1 in the first horizontal direction D1 and a second width W2 in the second horizontal direction D2. For example, the lower top bonding pad structures 60L may have the first width W1 in the first horizontal direction D1 and the second width W2 in the second horizontal direction. The second width W2 may be greater than the first width W1. For example, the second width W2 may be two or more times greater than the first width W1. Since the lower top bonding pad bodies 63L have a stretched square shape, they may have a greater volume than when having a square shape. Accordingly, the lower top bonding pad bodies 63L may expand greater in the bonding process. Accordingly, the lower top bonding pad bodies 63L and the upper via plug 51U may be bonded more strongly due to the increased expansion force.

The upper through-via plugs 51U may have a third width W3 in the first horizontal direction D1 and a fourth width W4 in the second horizontal direction D2. For example, the upper through-via structures 50U may have the third width W3 in the first horizontal direction D1 and the fourth width W4 in the second horizontal direction D2. The third width W3 and the fourth width W4 may be substantially the same. According to an embodiment of the disclosure, the third width W3 and the fourth width W4 may be different. For example, the third width W3 and the fourth width W4 may have a difference of less than 1.5 times. The third width W3 and the fourth width W4 of the upper through-via plugs 51U may be the same as the diameter in the first horizontal direction D1 and the diameter in the second horizontal direction D2, respectively. Alternatively, the third width W3 and the fourth width W4 of the upper through-via plugs 51U may be the same as the length of one side in the first horizontal direction D1 and the length of one side in the second horizontal direction D2, respectively.

The lower top bonding pad bodies 63L may be spaced apart from each other by a first space S1 in the first horizontal direction D1. The first space S1 may be smaller than a first width W1 of the lower top bonding pad bodies 63L. The first space S1 may be smaller than a third width W3 and a fourth width W4 of the upper through-via plug 51U. According to an embodiment of the disclosure, the first space S1 may be greater than the first width W1 of the lower top bonding pad bodies 63L. The first space S1 may be greater than the third width W3 and the fourth width W4 of the upper through-via plug 51U. The upper through-via structures 50U and the lower wiring vias 56L may be aligned to vertically overlap with each other.

FIGS. 4A to 4D are top or plan views illustrating overlapping and alignment of the lower top bonding pad bodies 63L of the lower top bonding pad structures 60L and the upper through-via plugs 51U of the upper through-via structures 50U in accordance with diverse embodiments of the disclosure.

Figure 4A:
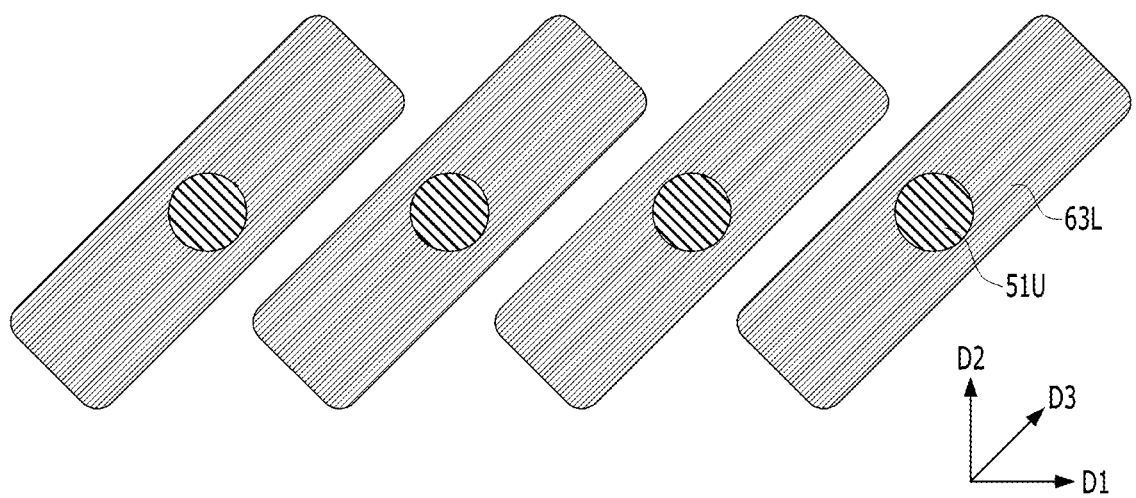
FIGS. 4A, 4B, 4C, and 4D are top or plan views illustrating overlapping and alignment of lower top bonding pad bodies of lower top bonding pad structures and upper through-via plugs of upper through-via structures in accordance with diverse embodiments of the disclosure.

Referring to FIG. 4A, the lower top bonding pad bodies 63L may have a shape that extends in a diagonal direction D3 with respect to the first horizontal direction D1 and the second horizontal direction D2. Compared to the lower top bonding pad bodies 63L of FIG. 3A, the lower top bonding pad bodies 63L may have a shape rotated at an arbitrary angle. The upper through-via plugs 51U may be aligned and disposed to overlap with the central regions of the lower top bonding pad bodies 63L, respectively.

Figure 4B:
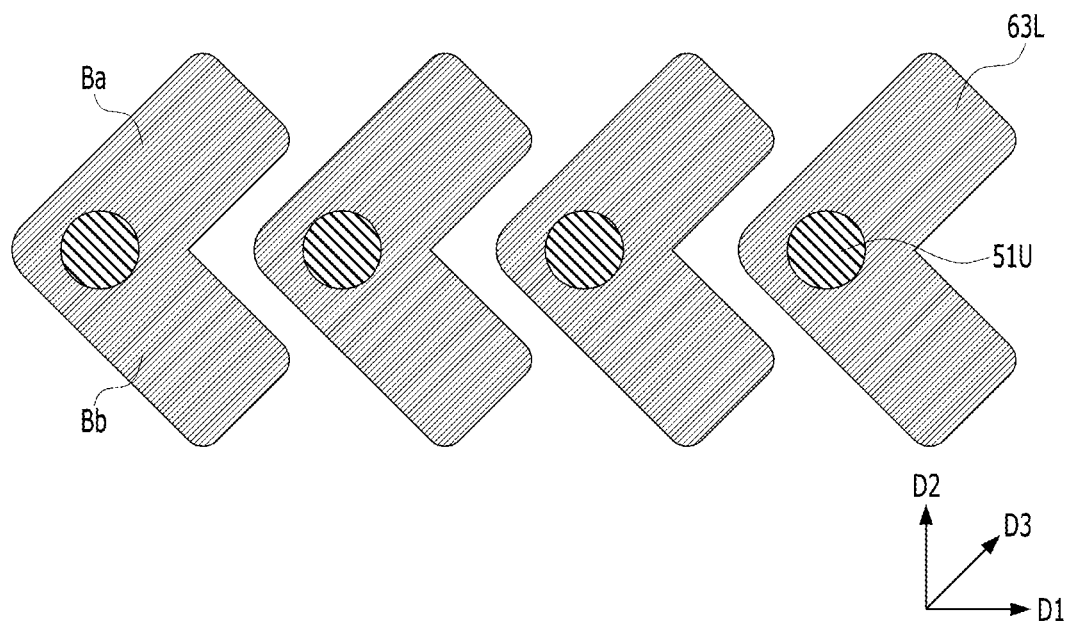

Referring to FIG. 4B, the lower top bonding pad bodies 63L may have a bracket shape or an arrowhead shape. For example, the lower top bonding pad bodies 63L may include a first body portion Ba and a second body portion Bb. Each of the first body portion Ba and the second body portion Bb may have a segment shape that coincides with or extends perpendicular to the diagonal direction D3. The first body portion Ba and the second body portion Bb may have an arbitrary angle. The upper through-via plugs 51U may be aligned and disposed to overlap with crossing regions of the first body portions Ba and the second body portions Bb.

Figure 4C:
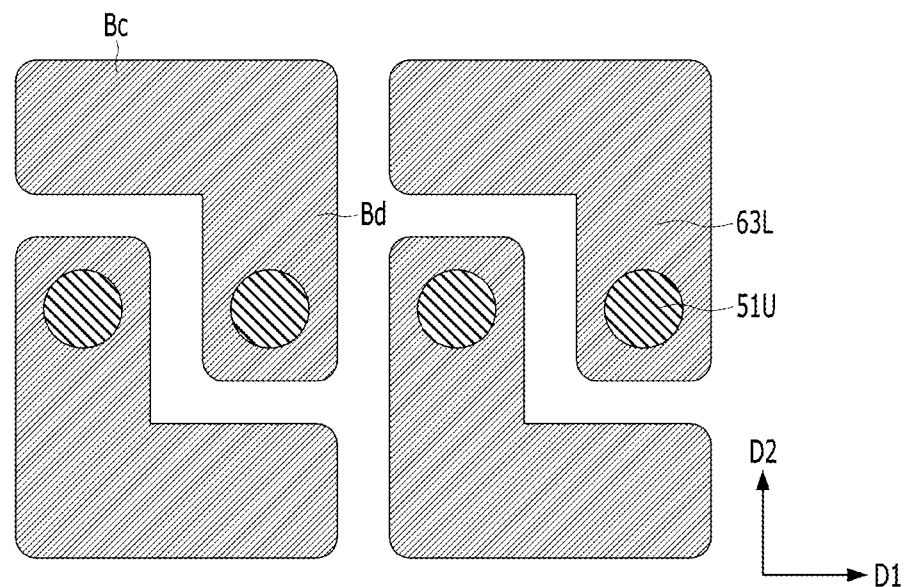
Figure 4D:
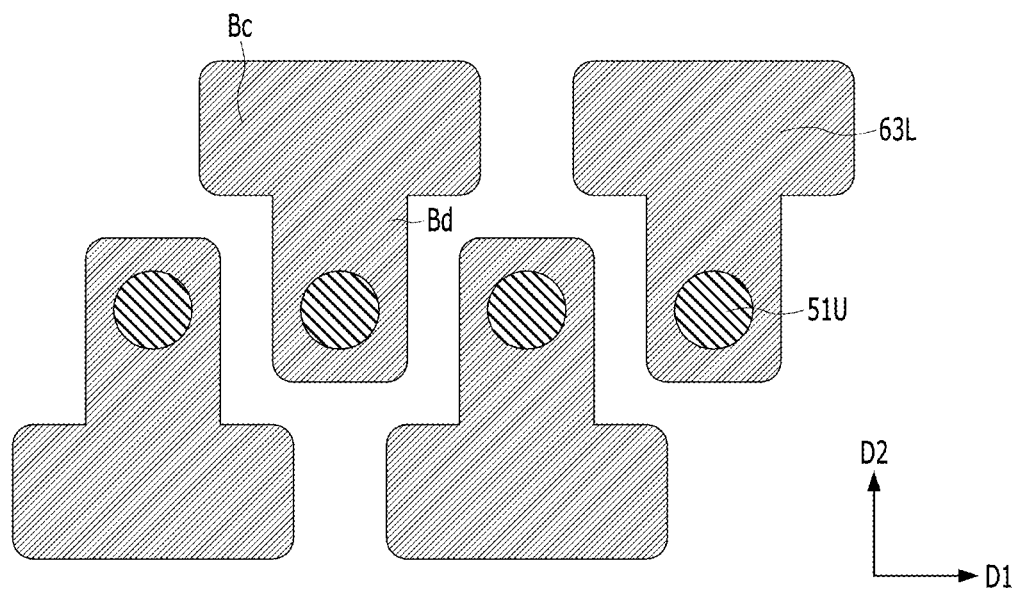

Referring to FIG. 4C, the lower top bonding pad bodies 63L may have an elbow shape. Referring to FIG. 4D, the lower top bonding pad bodies 63L may have a T-shape. In FIGS. 4C and 4D, each of the lower top bonding pad bodies 63L may have a first body portion Bc and a second body portion Bd that form an arbitrary angle. The second body portions Bd may protrude from one end of the first body portions Bc. The first body portions Bc may have a segment shape that coincides with the first horizontal direction D1 and extends perpendicularly to the second horizontal direction D2. The second body portions Bd may have a segment shape that is perpendicular to the first horizontal direction D1 and extends to coincide with the second horizontal direction D2. The lower top bonding pad bodies 63L may be arranged side by side in an alternating and interdigitated shape. For example, the neighboring lower top bonding pad bodies 63L may have a symmetrical or mirrored shape. The upper through-via plugs 51U may overlap with the second body portions Bd of the lower top bonding pad bodies 63L, for example, protruding portions. Constituent elements that are not described may be understood by referring to other drawings.

Figure 5A:
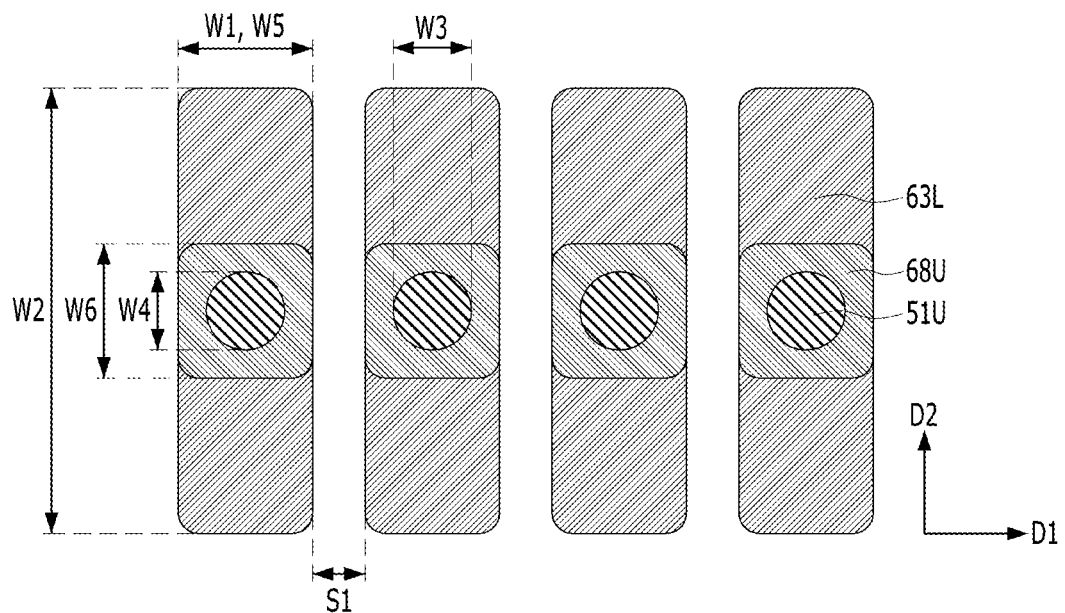
FIG. 5A is a layout illustrating overlapping and alignment of lower top bonding pad bodies of lower top bonding pad structures and upper bottom bonding pad barrier layers of upper bottom bonding pad structures in accordance with an embodiment of the disclosure.
Figure 5B:
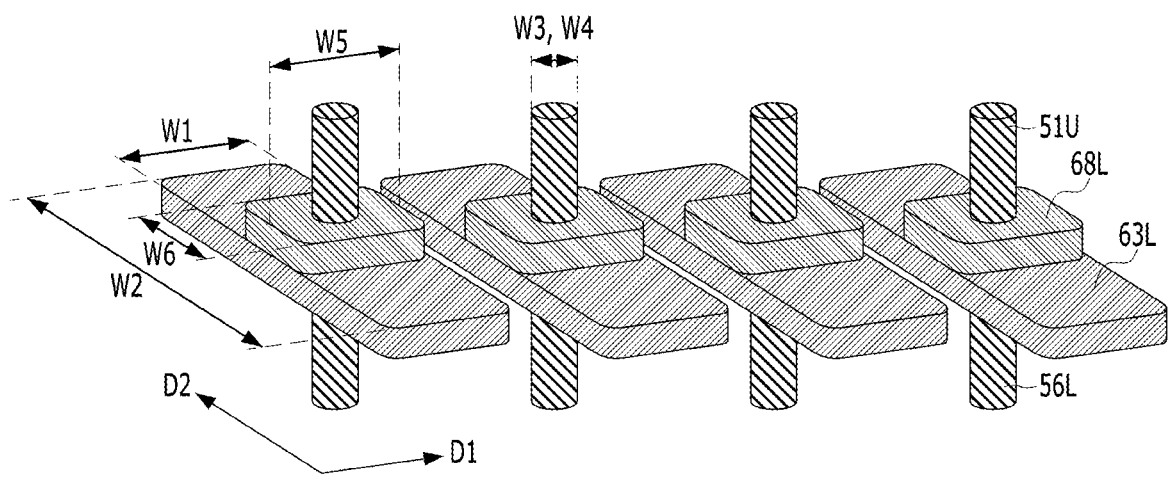
FIG. 5B is a perspective view illustrating a bonding structure of the lower top bonding pad bodies of the lower top bonding pad structures and the upper bottom bonding pad barrier layers of the upper bottom bonding pad structures.

FIG. 5A is a layout illustrating overlapping and alignment of the lower top bonding pad bodies 63L of the lower top bonding pad structures 60L and the upper bottom bonding pad bodies 68U of the upper bottom bonding pad structures 66U in accordance with an embodiment of the disclosure, and FIG. 5B is a perspective view illustrating a bonding structure of the lower top bonding pad bodies 63L of the lower top bonding pad structures 60L and the upper bottom bonding pad bodies 68U of the upper bottom bonding pad structures 66U.

Referring to FIGS. 5A and 5B, the lower top bonding pad bodies 63L of the lower top bonding pad structures 60L and the upper bottom bonding pad bodies 68U of the upper bottom bonding pad structures 66U may be aligned to overlap with each other to be bonded to each other. It is assumed that the upper bottom bonding pad bodies 68U are positioned to be vertically aligned with the central regions of the lower top bonding pad bodies 63L, respectively. The lower top bonding pad bodies 63L may be understood by referring to the lower top bonding pad bodies 63L which are shown in FIGS. 3A and 3B. The upper bottom bonding pad bodies 68U may also be arranged side by side in the first horizontal direction D1. The upper bottom bonding pad bodies 68U may have a circular shape or a square shape. According to an embodiment of the disclosure, the corner portions of the upper bottom bonding pad bodies 68U may also have a rounded or chamfered shape. It is assumed that the upper through-via plugs 51U are positioned to be vertically aligned with the central regions of the upper bottom bonding pad bodies 68U, respectively.

The upper bottom bonding pad bodies 68U may have a fifth width W5 in the first horizontal direction D1 and a sixth width W6 in the second horizontal direction D2. The fifth width W5 and the sixth width W6 may be substantially the same. According to an embodiment of the disclosure, the fifth width W5 and the sixth width W6 may be different from each other. For example, the fifth width W5 may be greater than the sixth width W6.

The first width W1 of the lower top bonding pad bodies 63L in the first horizontal direction D1 may be substantially the same as the fifth width W5 of the upper bottom bonding pad bodies 68U in the first horizontal direction D1. According to an embodiment of the disclosure, the first width W1 of the lower top bonding pad bodies 63L in the first horizontal direction D1 may be different from the fifth width W5 of the upper bottom bonding pad bodies 68U in the first horizontal direction D1. For example, the first width W1 of the lower top bonding pad bodies 63L in the first horizontal direction D1 may be greater than the fifth width W5 of the upper bottom bonding pad bodies 68U in the first horizontal direction D1. Conversely, the first width W1 of the lower top bonding pad bodies 63L in the first horizontal direction D1 may be smaller than the fifth width W5 of the upper bottom bonding pad bodies 68U in the first horizontal direction D1.

The second width W2 of the lower top bonding pad bodies 63L in the second horizontal direction D2 may be greater than the sixth width W6 of the upper bottom bonding pad bodies 68U in the second horizontal direction D2. For example, the second width W2 of the lower top bonding pad bodies 63L in the second horizontal direction D2 may be greater than the sixth width W6 of the upper bottom bonding pad bodies 68U in the second horizontal direction D2.

The upper through-via plugs 51U may have the third width W3 in the first horizontal direction D1 and the fourth width W4 in the second horizontal direction D2. The third width W3 of the upper through-via plugs 51U may be smaller than the fifth width W5 of the upper bottom bonding pad bodies 68U. The fourth width W4 of the upper through-via plugs 51U may be smaller than the sixth width W6 of the upper bottom bonding pad bodies 68U.

FIGS. 6A to 6D are top or plan views showing overlapping and alignment of the lower top bonding pad bodies 63L of the lower top bonding pad structures 60L and the upper bottom bonding pad bodies 68U of the upper bottom bonding pad structures 66U in accordance with diverse embodiments of the disclosure.

Figure 6A:
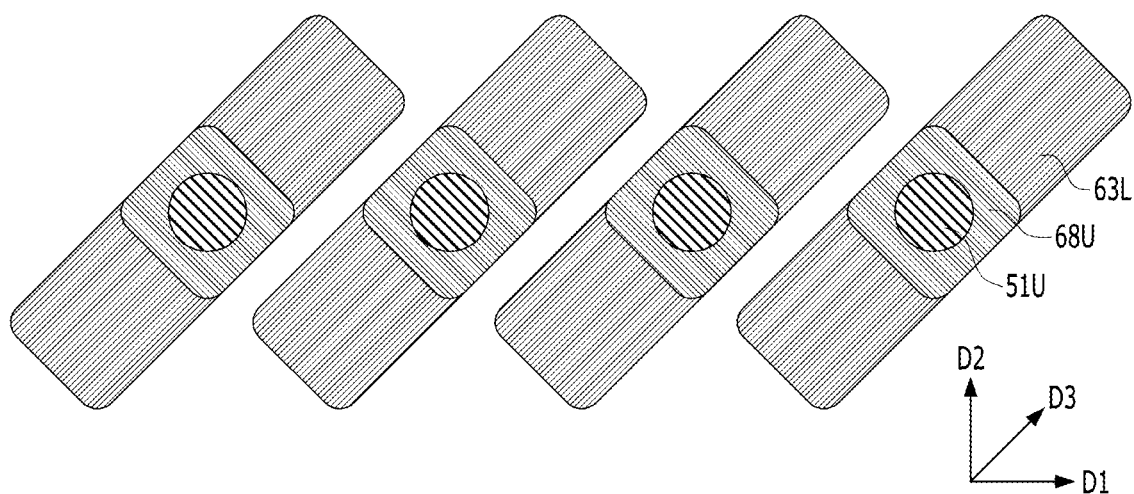
FIGS. 6A, 6B, 6C, and 6D are top or plan views showing overlapping and alignment of lower top bonding pad bodies of lower top bonding pad structures and upper bottom bonding pad barrier layers of upper bottom bonding pad structures in accordance with diverse embodiments of the disclosure.

Referring to FIG. 6A, the lower top bonding pad bodies 63L may have a bar or segment shape extending in a diagonal direction D3 with respect to the first horizontal direction D1 and the second horizontal direction D2. Compared with the lower top bonding pad bodies 63L of the lower top bonding pad structures 60L of FIG. 5A, they may have a shape rotated at an arbitrary angle. The upper bottom bonding pad bodies 68U may be aligned and disposed to overlap with the central regions of the lower top bonding pad bodies 63L, respectively. The upper through-via plugs 51U may be aligned and disposed to overlap with the central regions of the upper bottom bonding pad bodies 68U, respectively.

Figure 6B:
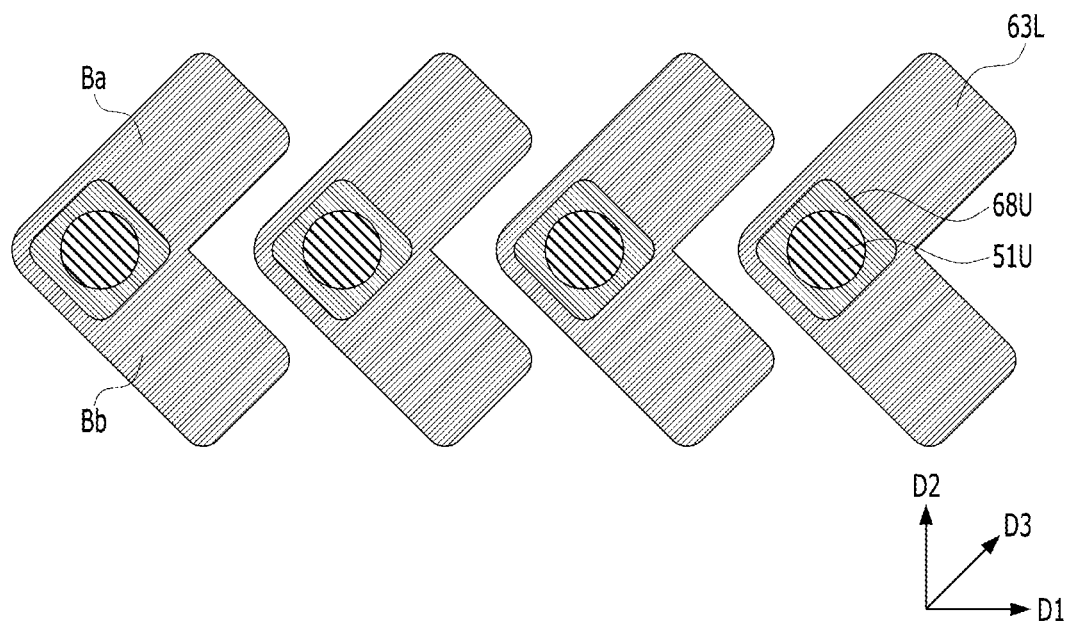

Referring to FIG. 6B, the lower top bonding pad bodies 63L may have a bracket shape or an arrowhead shape. The upper bottom bonding pad bodies 68U may be aligned and disposed to overlap with the crossing regions of the first body portions Ba and the second body portions Bb of the lower top bonding pad bodies 63L. The upper bottom bonding pad bodies 68U may have a square shape. According to an embodiment of the disclosure, the upper bottom bonding pad bodies 68U may have a circular shape. The upper through-via plugs 51U may be aligned and disposed to overlap with the central regions of the upper bottom bonding pad bodies 68U, respectively.

Figure 6C:
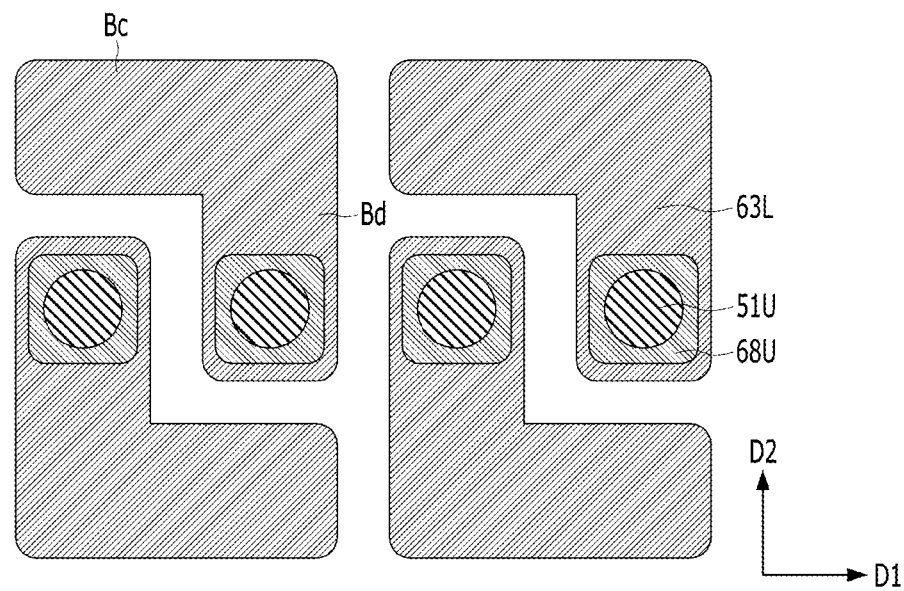
Figure 6D:
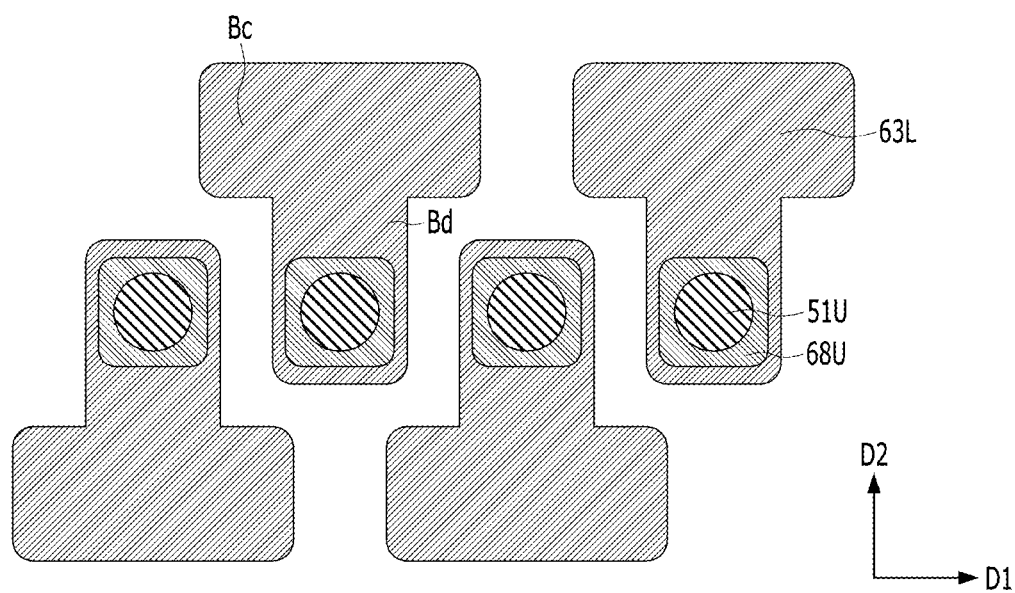

Referring to FIG. 6C, the lower top bonding pad bodies 63L may have an elbow shape. Referring to FIG. 6D, the lower top bonding pad bodies 63L may have a T-shape. In FIGS. 6C and 6D, the upper bottom bonding pad bodies 68U may include a first body portion Bc extending in the first horizontal direction and a second body portion Bd extending vertically from a portion of the first body portion Bc. Referring to FIG. 6C, the second body portion Bd may extend from the central region of the first body portion Bc, and referring to FIG. 6D, the second body portion Bd may extend from one of both ends of the first body portion Bc. In FIGS. 6C and 6D, the upper bottom bonding pad bodies 68U may be aligned and disposed to overlap with the second body portions Bd of the lower top bonding pad bodies 63L, respectively. The upper bottom bonding pad bodies Bc may be arranged side by side in the first horizontal direction D1. Constituent elements that are not described may be understood by referring to other drawings.

Figure 7A:
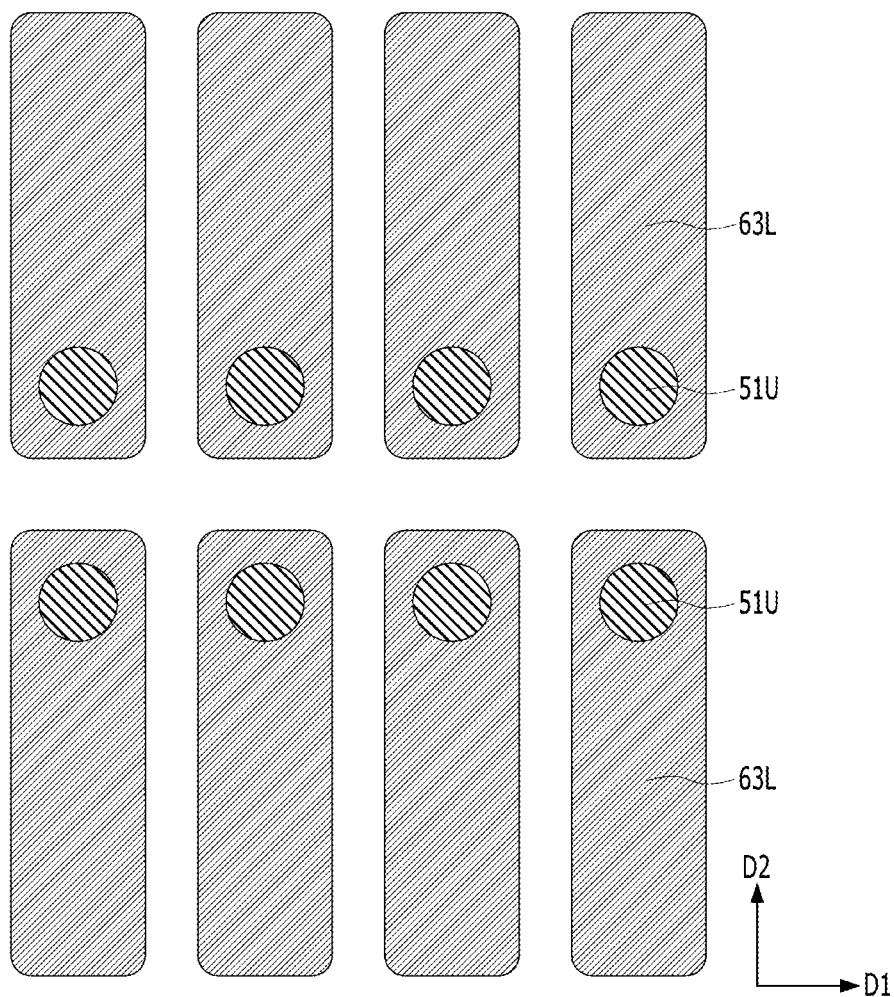
FIG. 7A is a layout illustrating overlapping and alignment of lower top bonding pad bodies and upper through-via plugs in accordance with an embodiment of the disclosure.
Figure 7B:
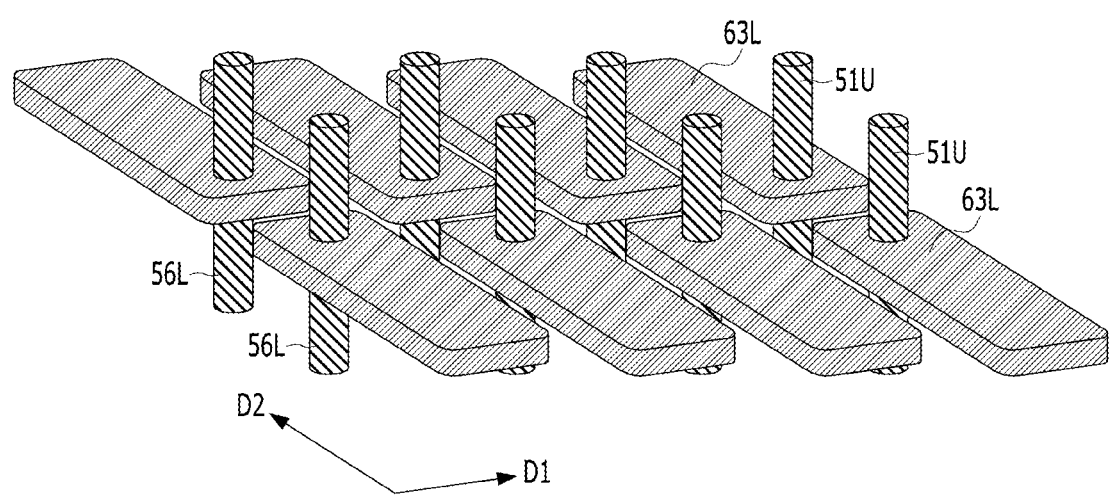
FIG. 7B is a perspective view illustrating a bonding structure of the lower top bonding pad bodies and the upper through-via plugs.

FIG. 7A is a layout illustrating overlapping and alignment of the lower top bonding pad bodies 63L and the upper through-via plugs 51U in accordance with an embodiment of the disclosure, and FIG. 7B is a perspective view illustrating a bonding structure of the lower top bonding pad bodies 63L and the upper through-via plugs 51U.

Referring to FIGS. 7A and 7B, the lower top bonding pad bodies 63L of the lower top bonding pad structures 60L and the upper through-via plugs 51U of the upper through-via structure 50U may be arranged side by side in two rows that are parallel in the first horizontal direction D1. The lower top bonding pad bodies 63L may have a segment shape extending in the second horizontal direction D2. The upper through-via plugs 51U may be aligned and disposed to vertically overlap with one end portions of the lower top bonding pad bodies 63L. The upper through-via plugs 51U may be aligned on a straight line in the second horizontal direction D2.

FIGS. 8A to 8E are top or plan views illustrating overlapping and alignment of the lower top bonding pad bodies 63L of the lower top bonding pad structures 60L and the upper through-via plugs 51U of the upper through-via structures 50U in accordance with diverse embodiments of the disclosure.

Figure 8A:
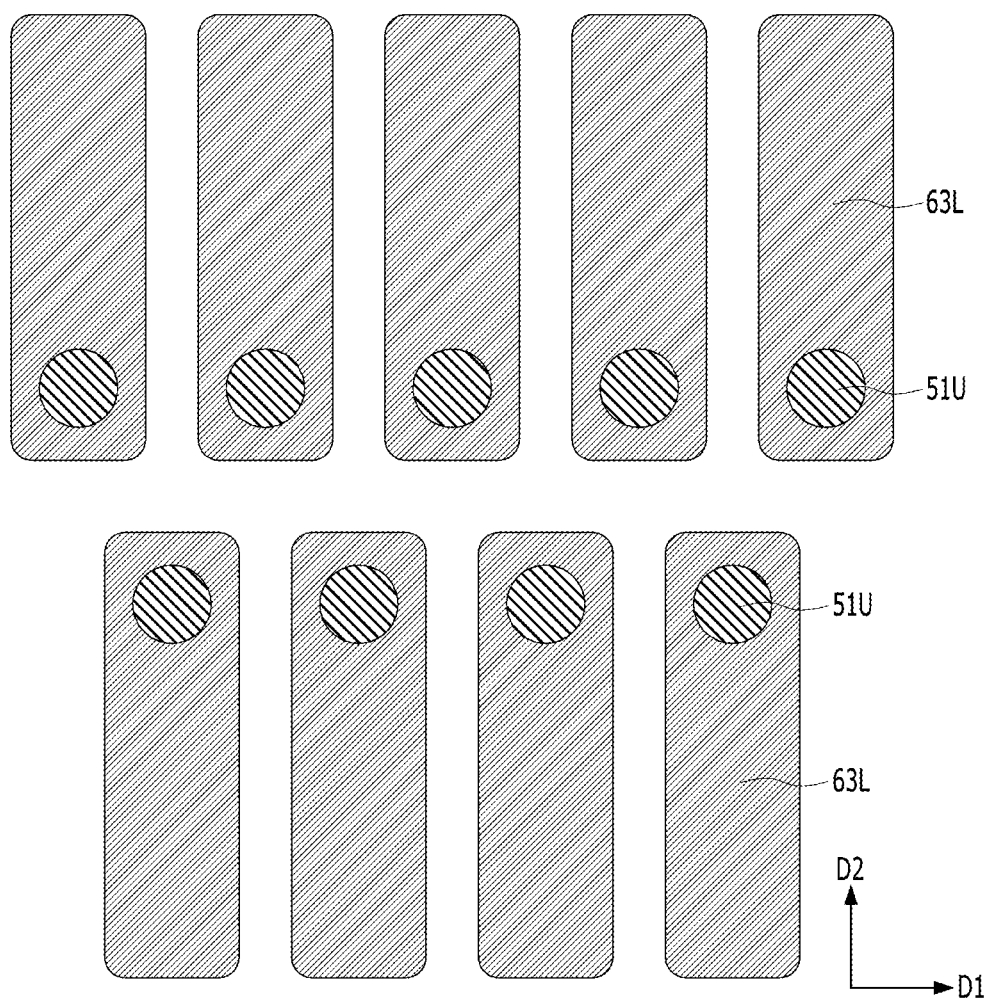
FIGS. 8A, 8B, 8C, 8D, and 8E are top or plan views illustrating overlapping and alignment of lower top bonding pad bodies of lower top bonding pad structures and upper through-via plugs of upper through-via structures in accordance with diverse embodiments of the disclosure.

Referring to FIG. 8A, the lower top bonding pad bodies 63L and the upper through-via plugs 51U that form two rows may be arranged in a zigzag shape in the first horizontal direction D1, respectively. For example, the lower top bonding pad bodies 63L and the upper through-via plugs 51U might not be aligned on a straight line in the second horizontal direction D2.

Figure 8B:
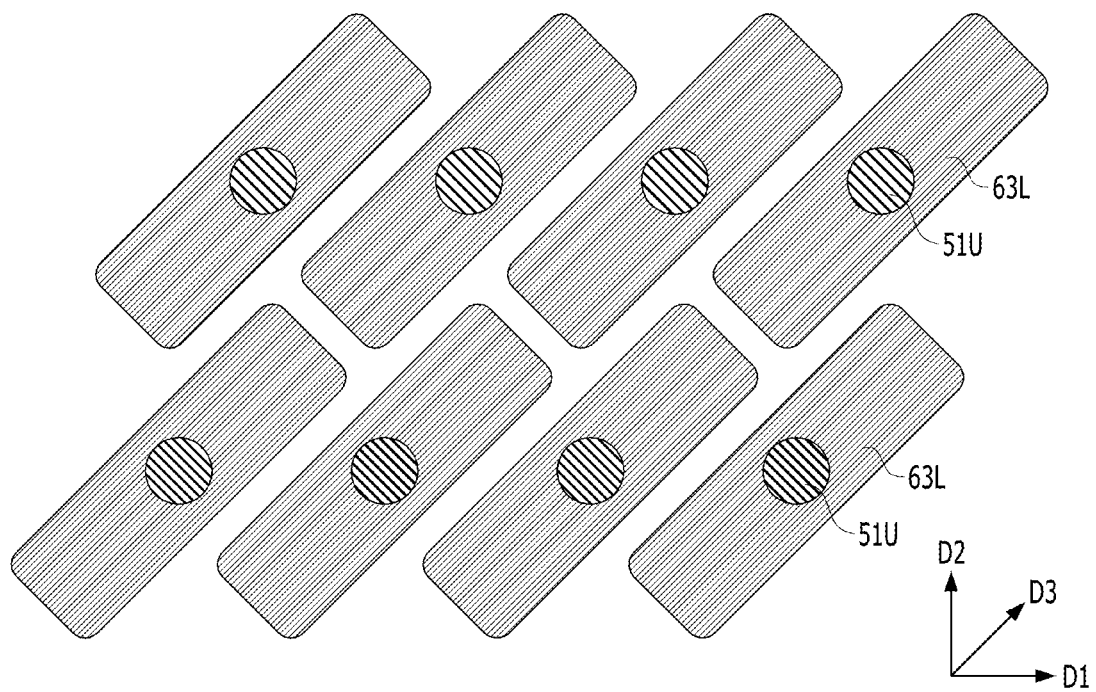
Figure 8C:
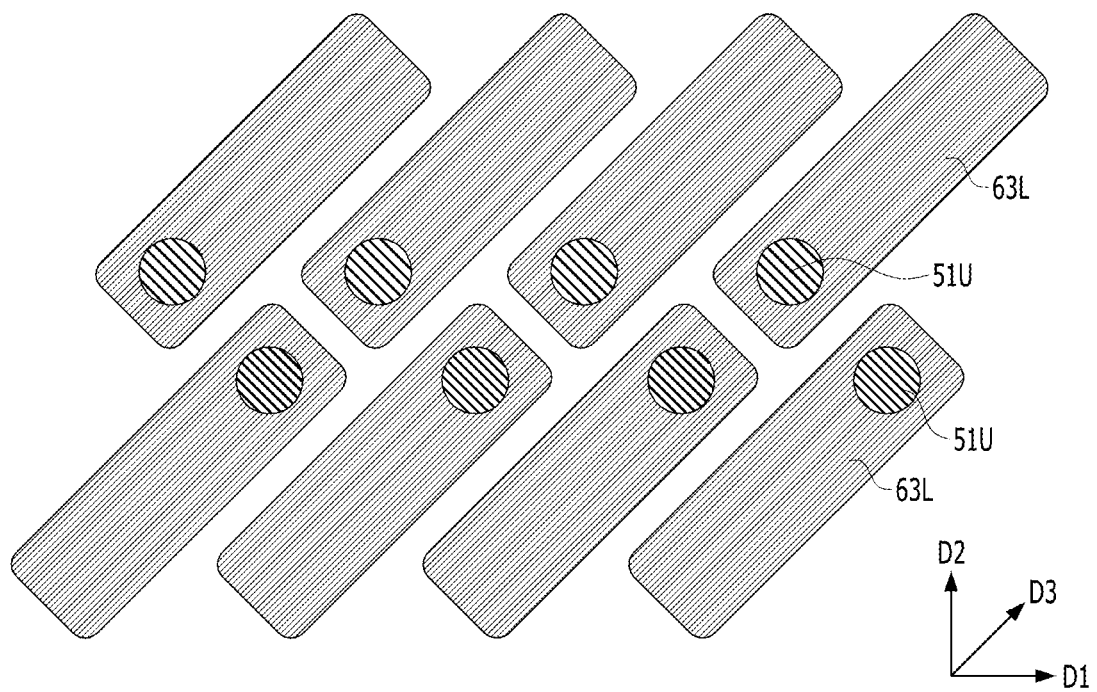

Referring to FIGS. 8B and 8C, the lower top bonding pad bodies 63L may have a bar or segment shape extending in the diagonal direction D3, and the lower top bonding pad bodies 63L and the upper through-via plugs 51U may be arranged in two parallel rows in the first horizontal direction D1, respectively. Referring to FIG. 8B, the upper through-via plugs 51U may be aligned and disposed to overlap with the central regions of the lower top bonding pad bodies 63L. The lower top bonding pad bodies 63L and the upper through-via plugs 51U may be aligned on a straight line in the second horizontal direction D2. Referring to FIG. 8C, the upper through-via plugs 51U may be aligned and disposed to overlap with one end portions of the lower top bonding pad bodies 63L. The lower top bonding pad bodies 63L and the upper through-via plugs 51U might not be aligned on a straight line in the second horizontal direction D2.

Figure 8D:
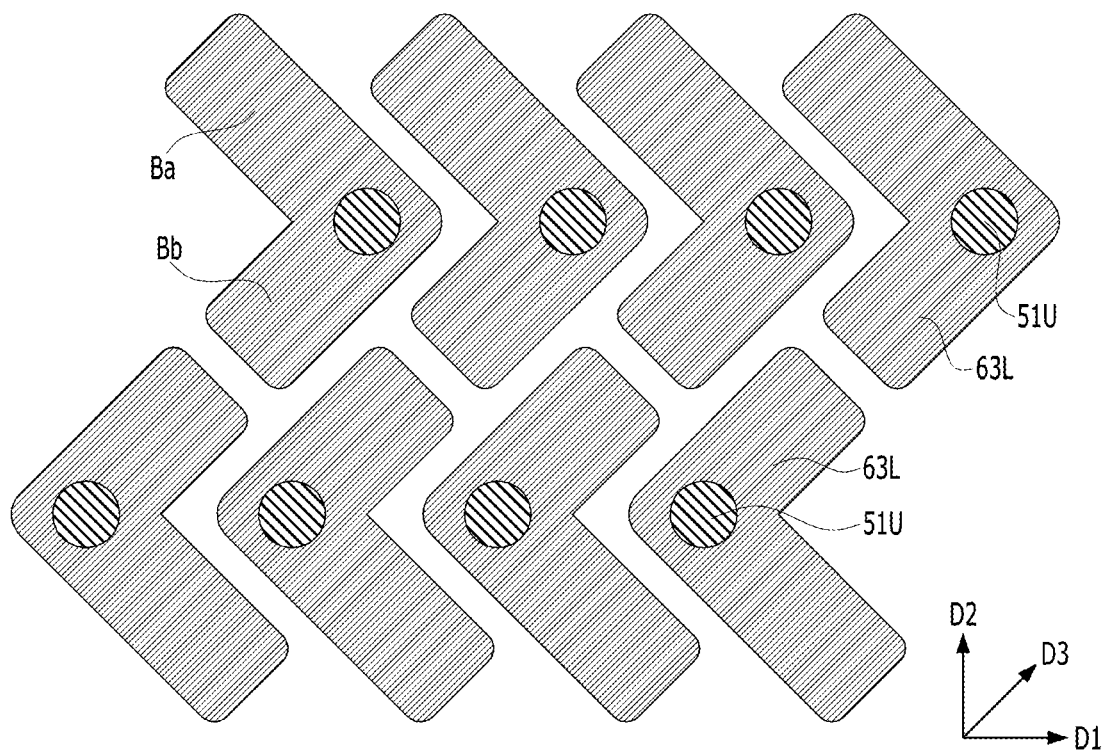

Referring to FIG. 8D, the lower top bonding pad bodies 63L may have a bracket shape, an arrowhead shape, or an elbow shape. The lower top bonding pad bodies 63L may have an asymmetric shape. For example, referring back to FIG. 6B, the sizes of the first body portions Ba and the second body portions Bb may be different. For example, the second body portions Bb may be smaller than the first body portions Ba. The upper through-via plugs 51U in the upper row and the upper through-via plugs 51U in the lower row may be aligned in the second horizontal direction D2.

Figure 8E:
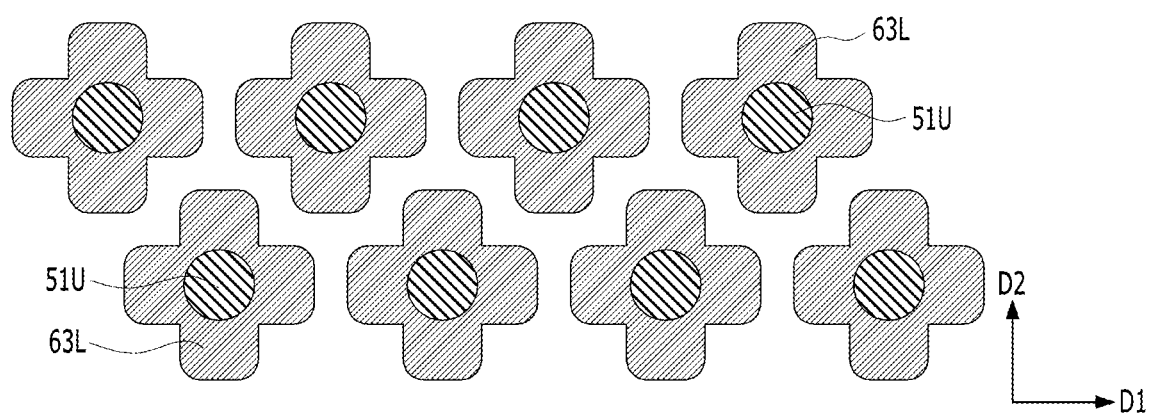

Referring to FIG. 8E, according to an embodiment of the present disclosure, the lower top bonding pad bodies 63L may have a cross shape. The upper through-via plugs 51U may be aligned and disposed to overlap with the central regions of the lower top bonding pad bodies 63L. The lower top bonding pad bodies 63L and the upper through-via plugs 51U may be arranged in parallel to form two parallel rows in the first horizontal direction D1. The lower top bonding pad bodies 63L and the upper through-via plugs 51U may be arranged in a zigzag shape in the first horizontal direction D1. For example, the lower top bonding pad bodies 63L and the upper through-via plugs 51U might not be aligned on a straight line in the second horizontal direction D2.

Figure 9A:
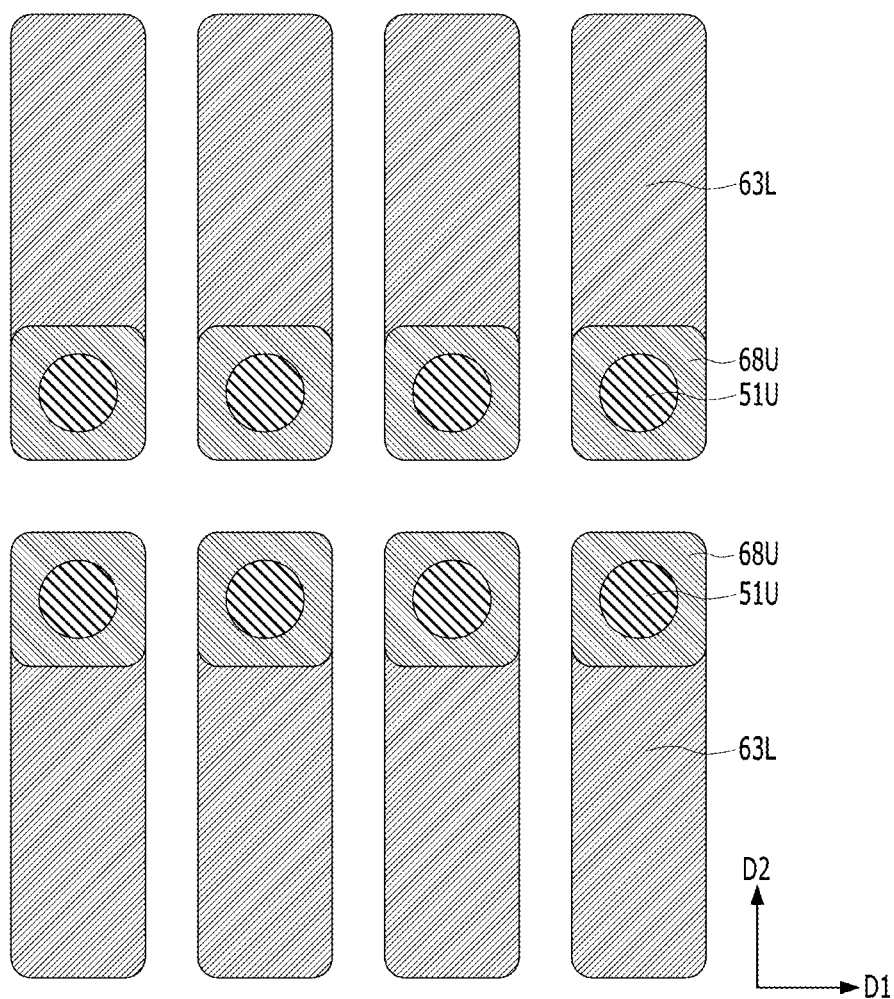
FIGS. 9A and 9B are layouts illustrating overlapping and alignment of lower top bonding pad bodies and upper bottom bonding pad barrier layers in accordance with an embodiment of the disclosure.
Figure 9B:
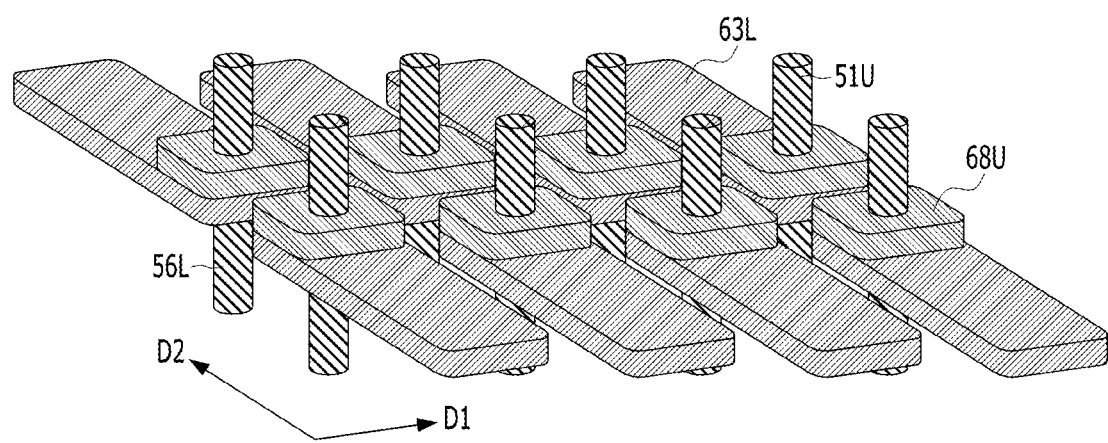

FIGS. 9A and 9B are layouts illustrating overlapping and alignment of the lower top bonding pad bodies 63L and the upper bottom bonding pad bodies 68U in accordance with an embodiment of the disclosure, and FIG. 9B is a perspective view illustrating the lower top bonding pad bodies 63L and the upper bottom bonding pad bodies 68U.

Referring to FIGS. 9A and 9B, the lower top bonding pad bodies 63L of the lower top bonding pad structures 60L and the upper bottom bonding pad bodies 68U of the upper bottom bonding pad structures 66U may be arranged side by side to form two parallel rows in the first horizontal direction D1. The upper bottom bonding pad bodies 68U may be aligned and disposed to vertically overlap with one end portions of the lower top bonding pad bodies 63L, respectively. The one end portions of the lower top bonding pad bodies 63L contacting the upper bottom bonding pad bodies 68U may be arranged to be adjacent to each other in the second horizontal direction D2. The upper through-via plugs 51U may be aligned and disposed to vertically overlap with the upper bottom bonding pad bodies 68U, respectively.

FIGS. 10A to 10E are top or plan views illustrating overlapping and alignment of the lower top bonding pad bodies 63L of the lower top bonding pad structures 60L and the upper bottom bonding pad bodies 68U of the upper bottom bonding pad structures 66U in accordance with diverse embodiments of the disclosure.

Figure 10A:
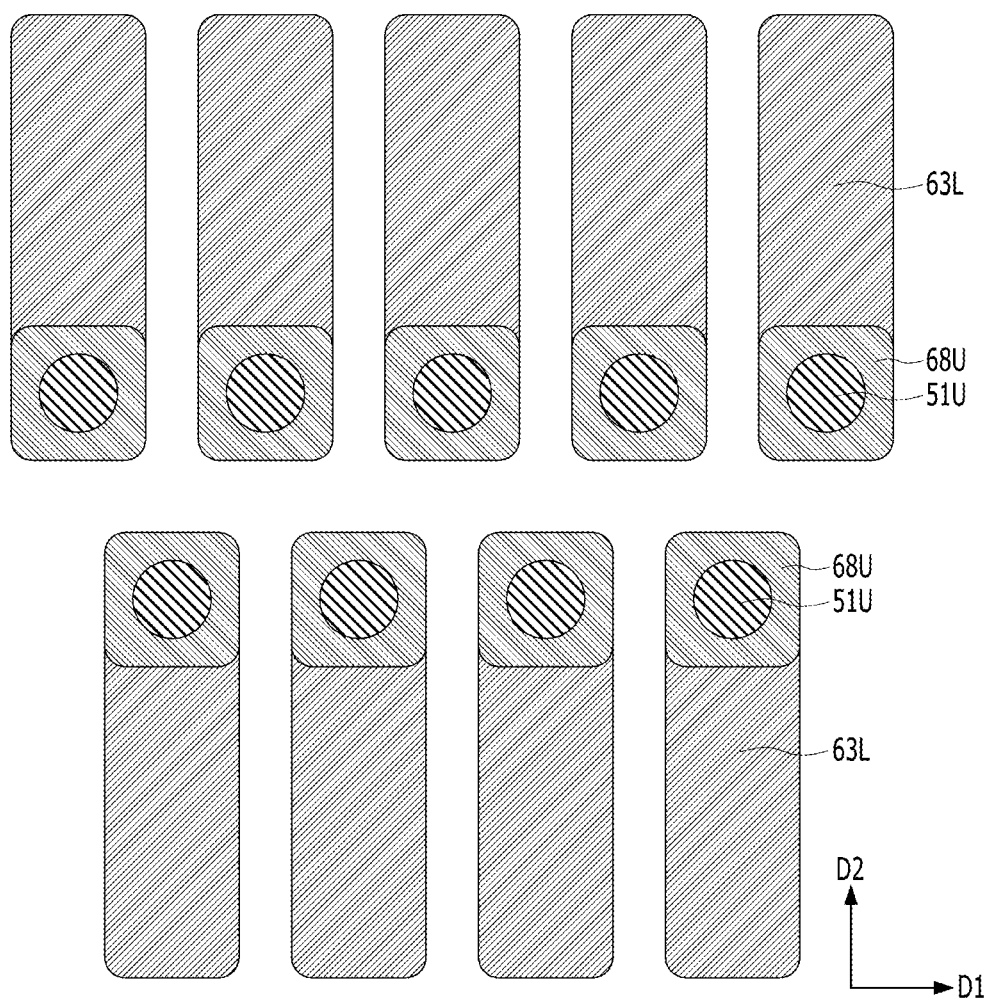
FIGS. 10A, 10B, 10C, 10D, and 10E are top or plan views illustrating overlapping and alignment of lower top bonding pad bodies of lower top bonding pad structures and upper bottom bonding pad barrier layers of upper bottom bonding pad structures in accordance with diverse embodiments of the disclosure.

Referring to FIG. 10A, the lower top bonding pad bodies 63L and the upper bottom bonding pad bodies 68U forming two rows may be arranged in a zigzag shape in the first horizontal direction D1, respectively. For example, the lower top bonding pad bodies 63L and the upper bottom bonding pad bodies 68U might not be aligned on a straight line in the second horizontal direction D2. The upper through-via plugs 51U may vertically overlap with the upper bottom bonding pad bodies 68U.

Figure 10B:
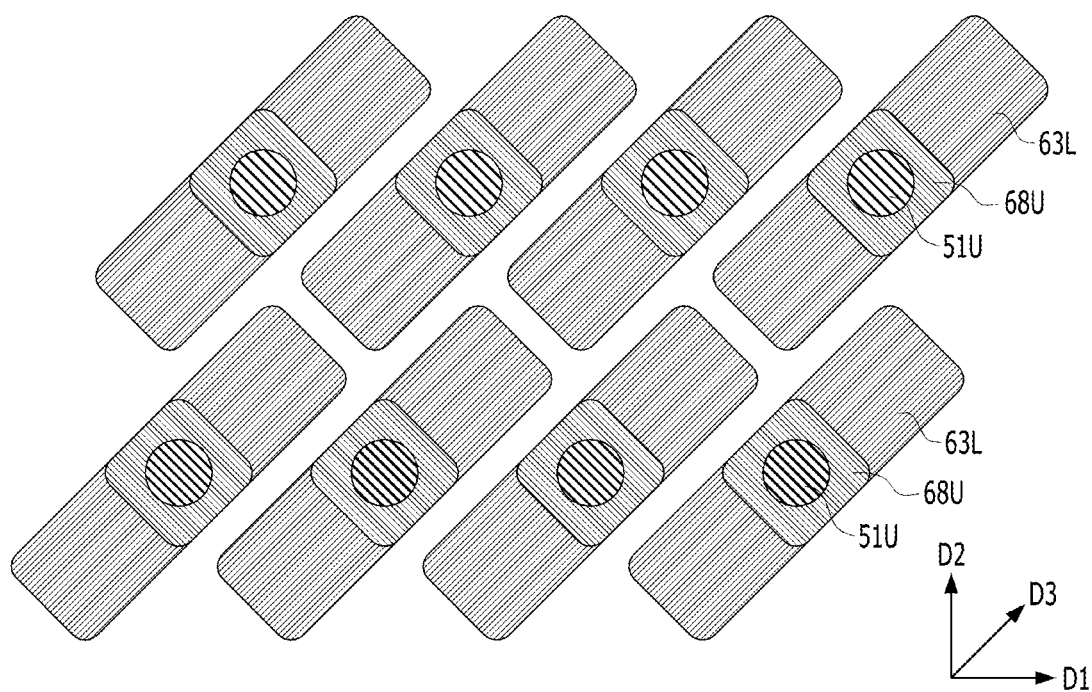
Figure 10C:
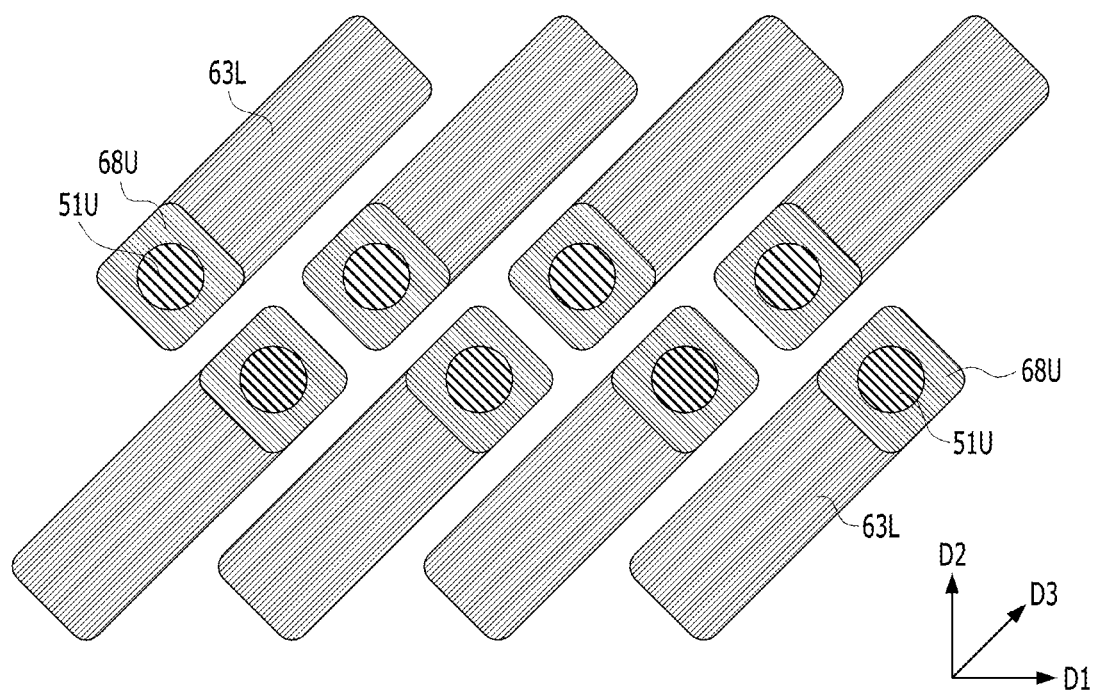

Referring to FIGS. 10B and 10C, the lower top bonding pad bodies 63L may have a bar or segment shape extending in the diagonal direction D3, and the lower top bonding pad bodies 63L and the upper bottom bonding pad bodies 68U may be arranged side by side to form two parallel rows in the first horizontal direction D1. Referring to FIG. 10B, the upper bottom bonding pad bodies 68U may be aligned and disposed to overlap with the central regions of the lower top bonding pad bodies 63L, respectively. The lower top bonding pad bodies 63L and the upper bottom bonding pad bodies 68U may be aligned on a straight line in the second horizontal direction D2. Referring to FIG. 10C, the upper bottom bonding pad bodies 68U may be aligned and disposed to overlap with one end portions of the lower top bonding pad bodies 63L, respectively. The lower top bonding pad bodies 63L and the upper bottom bonding pad bodies 68U might not be aligned on a straight line in the second horizontal direction D2. The upper through-via plugs 51U may vertically overlap with the upper bottom bonding pad bodies 68U.

Figure 10D:
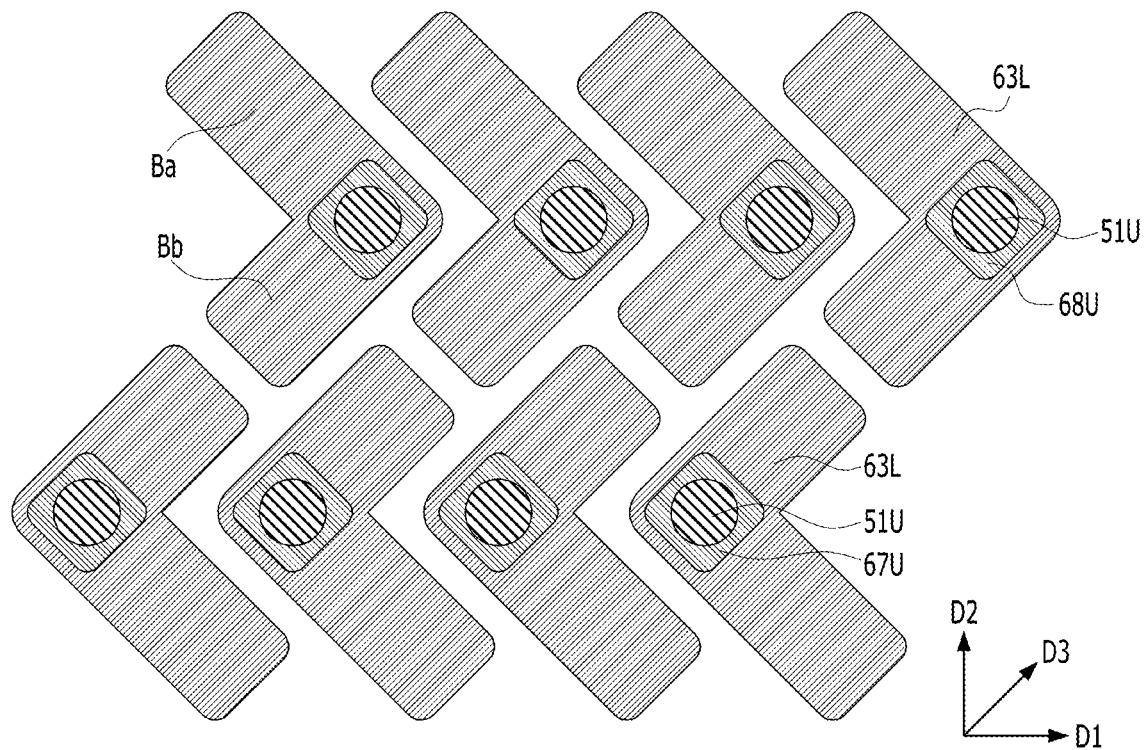

Referring to FIG. 10D, the lower top bonding pad bodies 63L may have a bracket shape, an arrowhead shape, or an elbow shape. The lower top bonding pad bodies 63L may have an asymmetric shape. The upper bottom bonding pad bodies 68U in the upper row and the upper bottom bonding pad bodies 68U in the lower row may be aligned in the second horizontal direction D2. The upper through-via plugs 51U may vertically overlap with the upper bottom bonding pad bodies 68U.

Figure 10E:
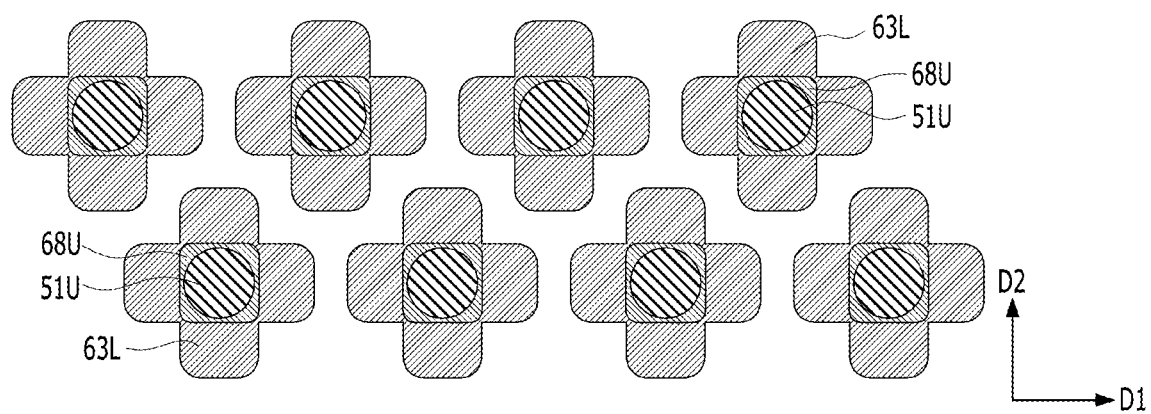

Referring to FIG. 10E, according to an embodiment of the present disclosure, the lower top bonding pad bodies 63L may have a cross shape. The upper bottom bonding pad bodies 68U may be aligned and disposed to overlap with the central regions of the lower top bonding pad bodies 63L. The lower top bonding pad bodies 63L and the upper bottom bonding pad bodies 68U may be arranged side by side to form two parallel rows in the first horizontal direction D1, respectively. The lower top bonding pad bodies 63L and the upper bottom bonding pad bodies 68U may be arranged in a zigzag shape in the first horizontal direction D1, respectively. For example, the lower top bonding pad bodies 63L and the upper bottom bonding pad bodies 68U might not be aligned on a straight line in the second horizontal direction D2. The upper through-via plugs 51U may vertically overlap with the upper bottom bonding pad bodies 68U.

According to diverse embodiments of the present disclosure, the lower top bonding pad body 62L of the lower top bonding pad structure 60L may have a greater area and a greater volume than the upper through-via plug 51U of the upper through-via structure 50U. Alternatively, the lower top bonding pad body 62L of the lower top bonding pad structure 60L may have a greater area and a greater volume than the upper bottom bonding pad bodies 68U of the upper bottom bonding pad structure 66U. For example, the lower top bonding pad bodies 62L may have an area twice or more as big as the area of the upper through-via plugs 51U or the upper bottom bonding pad bodies 68U. Therefore, in the hybrid bonding process, the lower top bonding pad bodies 62L may expand and the physical volume for hybrid bonding may increase. In other words, more stable and enhanced hybrid bonding may be provided than when the areas of the lower top bonding pad bodies 62L and the upper through-via plugs 51U are the same or less than twice.

Figure 11:
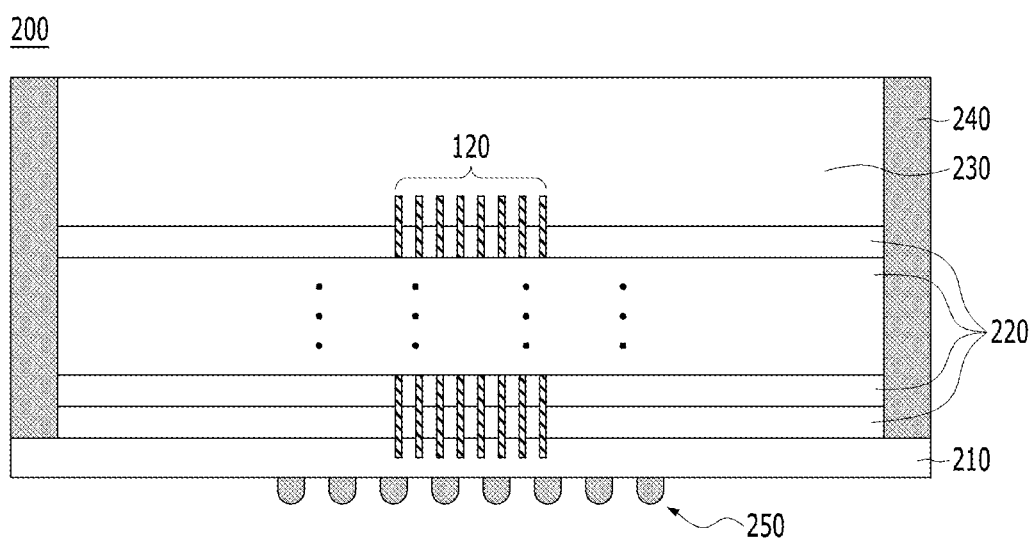
FIG. 11 is a side cross-sectional view schematically illustrating a semiconductor device stack in accordance with an embodiment of the disclosure.

FIG. 11 is a side cross-sectional view schematically illustrating a semiconductor device stack 200 in accordance with an embodiment of the disclosure. Referring to FIG. 11, the semiconductor device stack 200 may include a plurality of semiconductor dies 220 stacked over a base die 210, and a top die 230. The base die 210 may include an internal logic circuit and a test circuit, and bumps (not shown) over a lower surface. According to an embodiment of the disclosure, the base die 210 may include an interposer or a package substrate. The base die 210 may be referred to as a lower die 110L. The semiconductor dies 220 may include a memory device or a logic device. The memory device may include a volatile or nonvolatile semiconductor memory such as DRAM, SRAM, ReRAM, PcRAM, MRAM, NOR Flash, or NAND Flash. The top die 230 may also include a memory device or a logic device. The top die 230 may have a thickness that is different from any one of the semiconductor dies 220 in order to adjust the height specification of the semiconductor device stack 200. For example, the top die 230 may be thicker than the semiconductor dies 220. According to an embodiment of the disclosure, the top die 230 may have the same thickness as any one of the semiconductor dies 220. Side surfaces of the semiconductor dies 220 and the top die 230 may be wrapped with a molding layer 240. Peripherals of the base die 210 may be exposed in the shape of a terrace. The molding layer 240 may cover the top surfaces of the exposed peripheral portions of the base die 210. The molding layer 240 and the base die 210 may be vertically aligned in such a manner that a side surface of the molding layer 240 and a side surface of the base die 210 are coplanar. The molding layer 240 may include an epoxy molding compound. Bumps 250 may be disposed over the lower surface of the base die 210. The bumps 250 may electrically connect the semiconductor device stack 200 to an external interposer, a board substrate, or a system. The semiconductor device stack 200 according to the embodiment of the disclosure may also be applied to high bandwidth memories (HBMs).

According to the embodiments of the disclosure, in the semiconductor die stack structure and the semiconductor die bonding structure of a hybrid bonding structure, bonding of conductive constituent elements may be enhanced. Thus, performance of a semiconductor system may be stabilized and improved.

While the disclosure has been described with respect to the specific embodiments, it will be apparent to those skilled in the art that various changes and modifications may be made without departing from the spirit and scope of the disclosure as defined in the following claims.

What is claimed is:

1. A semiconductor die bonding structure, comprising:
 a lower die including a lower top bonding dielectric layer and lower connection structures; and
 an upper die stacked over the lower die in a vertical direction and including an upper bottom bonding dielectric layer and upper connection structures,
 wherein:
 the lower top bonding dielectric layer and the upper bottom bonding dielectric layer are directly bonded to each other,
 each of the lower connection structures includes a lower top bonding pad structure having a first width in a first horizontal direction and a second width in a second horizontal direction, each of the upper connection structures includes an upper bottom bonding pad structure having a third width in the first horizontal direction and a fourth width in the second horizontal direction;

the first horizontal direction, the second horizontal direction, and the vertical direction are substantially perpendicular to one another, the second width is greater than the first width, and the second width is greater than the fourth width.

2. The semiconductor die bonding structure of claim 1, wherein the second width is at least twice as large as the first width.

3. The semiconductor die bonding structure of claim 1, wherein the first width is greater than the third width.

4. The semiconductor die bonding structure of claim 1, wherein the third width and the fourth width are substantially the same.

5. The semiconductor die bonding structure of claim 1, wherein the lower die further comprises:
a lower substrate;
a lower inter-layer dielectric layer over an active surface of the lower substrate; and
a lower wiring dielectric layer between the lower inter-layer dielectric layer and the lower top bonding dielectric layer,
wherein each of the lower connection structures further comprises:
a lower through-via structure vertically penetrating the lower substrate and the lower inter-layer dielectric layer;
a lower wiring via pad disposed over the lower inter-layer dielectric layer to contact an upper end of the lower through-via structure; and
a lower via, vertically penetrating the lower wiring dielectric layer to electrically connect the lower via pad to the lower top bonding pad structure of each of the lower connection structures.

6. The semiconductor die bonding structure of claim 5, wherein each lower top bonding pad structure comprises:
a lower top bonding pad base disposed over the lower wiring dielectric layer to contact the lower wiring via;
a lower top bonding pad barrier layer over the lower top bonding pad base; and
a lower top bonding pad body over the lower top bonding pad barrier layer,
wherein the lower top bonding dielectric layer surrounds a side surface of the lower top bonding pad structure.

7. The semiconductor die bonding structure of claim 1, wherein the upper die further comprises:
an upper substrate;
an upper passivation layer over a non-active surface of the upper substrate, and
the upper bottom bonding dielectric layer is disposed over a lower surface of the upper passivation layer,
wherein each of the upper connection structures further comprises an upper through-via structure connected to the upper bottom bonding structure by vertically penetrating the upper substrate and the upper passivation layer.

8. The semiconductor die bonding structure of claim 1, wherein each upper bottom bonding pad structure is in direct contact with a central region or one end portion of each lower top bonding pad structure.

9. The semiconductor die bonding structure of claim 8, wherein each lower top bonding pad structure has one among a segment shape extending in the second horizontal direction, a bracket shape, and an arrowhead shape.

10. The semiconductor die bonding structure of claim 8, wherein each of the lower top bonding pad structures has one shape among an elbow shape, a T-shape, and a cross shape which has a first body portion and a second body portion extending from one end of the first body portion.

11. The semiconductor die bonding structure of claim 10, wherein neighboring lower top bonding pad structures have a symmetrical shape.

12. The semiconductor die bonding structure of claim 11, wherein each lower top bonding pad structure is arranged side by side in an interdigitated form such that the lower top bonding pad structures alternate in the first horizontal direction.

13. The semiconductor die bonding structure of claim 1, wherein each lower top bonding pad structure and the upper bottom bonding pad structures are arranged side by side in two rows in the first horizontal direction, respectively.

14. The semiconductor die bonding structure of claim 13, wherein each lower top bonding pad structure and the upper bottom bonding pad structures are arranged in zigzag in the first horizontal direction, respectively.

15. A semiconductor die bonding structure, comprising:
a lower die including a lower top bonding dielectric layer and a lower connection structure; and
an upper die stacked over the lower die and including an upper bottom bonding dielectric layer and an upper connection structure,
wherein the lower connection structure comprises:
a lower through-via structure including a lower through-via plug, a lower through-via barrier layer surrounding a side surface of the lower through-via plug, and a lower through-via liner layer surrounding a side surface of the lower through-via barrier layer, wherein the lower through-via structure penetrates the lower substrate in a vertical direction; and
a lower top bonding pad structure including a lower top bonding pad base, a lower top bonding pad barrier layer over the lower top bonding pad base, and a lower top bonding pad body over the lower top bonding pad barrier layer,
wherein:
the lower top bonding dielectric layer and the upper bottom bonding dielectric layer are directly bonded to each other,
the lower top bonding pad structure and the upper connection structure are bonded to each other,
an upper surface of the lower connection structure has a first width in a first horizontal direction and a second width in a second horizontal direction,
a lower surface of the upper connection structure has a third width in the first horizontal direction and a fourth width in the second horizontal direction,
the first horizontal direction, the second horizontal direction, and the vertical direction being substantially perpendicular to one another, and
the second width is at least twice as large as the first width and the fourth width.

16. The semiconductor die bonding structure of claim 15, wherein the upper connection structure comprises:
an upper through-via structure including an upper through-via plug, an upper through-via barrier layer surrounding a side surface of the upper through-via plug, and an upper through-via liner layer surrounding a side surface of the upper through-via barrier layer;
an upper bottom bonding pad barrier layer; and
an upper bottom bonding pad body over a lower surface of the upper bottom bonding pad barrier layer, and the upper bottom bonding pad body and the lower top bonding pad body are directly bonded.

17. The semiconductor die bonding structure of claim 15, wherein an interface between the lower top bonding dielectric layer and the upper bottom bonding dielectric layer and an interface between the lower top bonding pad structure and the upper connection structure are coplanar.

18. A semiconductor die bonding structure, comprising:
a lower die including a lower top bonding dielectric layer and lower connection structures;
an upper die stacked over the lower die and including an upper bottom bonding dielectric layer and upper connection structures,
wherein:
the lower top bonding dielectric layer and the upper bottom bonding dielectric layer are directly bonded to each other,
each of the lower connection structures and each of the upper connection structures are aligned in a vertical direction, to be directly bonded,
the lower connection structures and the upper connection structures are arranged side by side in a first horizontal direction, respectively;
an upper surface of each of the lower connection structures has a first width in the first horizontal direction and a second width in a second horizontal direction,
a lower surface of each of the upper connection structures has a third width in the first horizontal direction and a fourth width in the second horizontal direction,
the first horizontal direction, the second horizontal direction, and the vertical direction are substantially mutually perpendicular; and
the second width is greater than the first width and the fourth width.

* * * * *

UNITED STATES PATENT AND TRADEMARK OFFICE
CERTIFICATE OF CORRECTION

PATENT NO. : 11,876,052 B2
APPLICATION NO. : 17/324973
DATED : January 16, 2024
INVENTOR(S) : Na Bin Won and Jong Hoon Kim It is certified that error appears in the above-identified patent and that said Letters Patent is hereby corrected as shown below:

In the Claims

Claim 1 under "What is claimed is" in Column 16, Line 63:
Please replace: "1. A semiconductor die bonding structure, comprising: a lower die including a lower top bonding dielectric layer and lower connection structures; and an upper die stacked over the lower die in a vertical direction and including an upper bottom bonding dielectric layer and upper connection structures, wherein: the lower top bonding dielectric layer and the upper bottom bonding dielectric layer are directly bonded to each other, each of the lower connection structures includes a lower top bonding pad structure having a first width in a first horizontal direction and a second width in a second horizontal direction, each of the upper connection structures includes an upper bottom bonding pad structure having a third width in the first horizontal direction and a fourth width in the second horizontal direction; the first horizontal direction, the second horizontal direction, and the vertical direction are substantially perpendicular to one another, the second width is greater than the first width, and the second width is greater than the fourth width."

With --1. A semiconductor die bonding structure, comprising: a lower die including a lower top bonding dielectric layer and lower connection structures; and an upper die stacked over the lower die in a vertical direction and including an upper bottom bonding dielectric layer and upper connection structures, wherein: the lower top bonding dielectric layer and the upper bottom bonding dielectric layer are directly bonded to each other, the lower connection structures and the upper connection structures are directly bonded to each other, each of the lower connection structures includes a lower top bonding pad structure having a first width in a first horizontal direction and a second width in a second horizontal direction, each of the upper connection structures includes an upper bottom bonding pad structure having a third width in the first horizontal direction and a fourth width in the second horizontal direction; the first horizontal direction, the second horizontal direction, and the vertical direction are substantially perpendicular to one another, the second width is greater than the first width, and the second width is greater than the fourth width.--

Signed and Sealed this
Twentieth Day of February, 2024

*Katherine Kelly Vidal*
Katherine Kelly Vidal
*Director of the United States Patent and Trademark Office*